United States Patent [19]
Komatsu et al.

[11] Patent Number: 5,969,564
[45] Date of Patent: Oct. 19, 1999

[54] INSULATED-GATE FIELD EFFECT TRANSISTOR AND METHOD FOR DRIVING THEREOF

[75] Inventors: Yasutoshi Komatsu, Kanagawa; Yutaka Hayashi, Ibaraki, both of Japan

[73] Assignee: Sony Corporation, Tokyo, Japan

[21] Appl. No.: 09/019,555

[22] Filed: Feb. 6, 1998

[30] Foreign Application Priority Data

Feb. 7, 1997 [JP] Japan ................................ 9-024888
Jan. 20, 1998 [JP] Japan ................................ 10-008540

[51] Int. Cl.⁶ .................................................. H03K 3/01
[52] U.S. Cl. ............................ 327/534; 327/390; 327/434
[58] Field of Search ................................ 327/534, 535, 327/390, 434, 427, 589, 537

[56] References Cited

U.S. PATENT DOCUMENTS

| | | | |
|---|---|---|---|
| 5,514,994 | 5/1996 | Sawada | 327/390 |
| 5,543,650 | 8/1996 | Au et al. | 257/355 |
| 5,729,165 | 3/1998 | Lou et al. | 327/589 |
| 5,828,262 | 10/1998 | Rees | 327/390 |

FOREIGN PATENT DOCUMENTS

WO 96/07205  3/1996  WIPO.

*Primary Examiner*—Tim Callahan
*Assistant Examiner*—Jung Ho Kim
*Attorney, Agent, or Firm*—Ronald P. Kananen; Rader, Fishman & Grauer PLLC

[57] ABSTRACT

An insulated-gate field effect transistor comprising a channel forming region, source/drain regions, a gate region, a bias supplying means, and a capacitive element, wherein a potential for controlling a gate threshold voltage of the insulated-gate field effect transistor in an off-state thereof is applied to the channel forming region through the bias supplying means, and a signal having approximately the same phase as a phase of a signal supplied to the gate region is supplied to the channel forming region through the capacitive element.

44 Claims, 21 Drawing Sheets

[STEP-210]

[STEP-220]

[STEP-230]

[STEP-240]

[STEP-620]

[STEP-630]

[STEP-650]

INSULATED-GATE FIELD EFFECT TRANSISTOR AND METHOD FOR DRIVING THEREOF

BACKGROUND OF THE INVENTION AND RELATED ART

The present invention relates to an insulated-gate field effect transistor and a method of driving the same.

As one of methods for effectively accomplishing a low power consumption in an integrated circuit, there is a method of decreasing a power supply voltage. The gate threshold voltage $V_{th}$ in an MOS integrated circuit is generally 0.4 to 0.6 volt. When the method of decreasing a power supply voltage is applied to an MOS integrated circuit and the power supply voltage is equal to, or less than, 1 volt, therefore, there arises a problem that the operation speed of an MOS transistor element decreases. Further, when the gate threshold voltage $V_{th}$ is decreased (e.g., to about 0.2 volt) for decreasing a power supply voltage, leakage current caused by sub-threshold current flows even when the MOS transistor element is in an off-state, a stand-by current is no longer negligible, and there is caused a limit in decreasing power consumption. As a technology for preventing the flow of leakage current even when the MOS transistor element is in an off-state, the following technology is known.

That is, as a first prior art, as shown in FIG. 21, there is known a method in which an MOS transistor element $TR_1$ having a low gate threshold voltage $V_{th-L}$ and an MOS transistor element $TR_2$ having a high threshold voltage $V_{th-H}$ are combined, and when the MOS transistor element $TR_1$ in a circuit block is not operated, the occurrence of leakage current in the MOS transistor element $TR_1$ is inhibited by bringing the MOS transistor element $TR_2$ into an off-state.

In a second prior art, as FIG. 22 shows an equivalent circuit and a schematic cross sectional view, a channel forming region is connected to a gate portion, and the gate threshold voltage $V_{th}$ of an MOS transistor element is set at a value close to conventional ones. And, the channel forming region is biased to a forward direction with a voltage of an input signal, whereby the gate threshold voltage $V_{th}$ is controlled so as to have a small value.

As a third prior art, as shown in FIG. 23, there is known a method in which a voltage of a channel forming region (well in FIG. 23) of an MOS transistor element or an MOS transistor element block is controlled, thereby to change the gate threshold voltage $V_{th-ON}$ when the transistor element is in an on-state and the gate threshold voltage $V_{th-OFF}$ when the transistor element is in an off-state. That is, there is used a phenomenon in which, for an n-channel transistor, when the voltage of the channel forming region (well) is decreased, the gate threshold voltage increases (that is, a high $V_{th-OFF}$ is obtained and the occurrence of leakage current is prevented) and when the voltage of the channel forming region (well) is increased, the gate threshold voltage decreases (that is, a low $V_{th-ON}$ is obtained and a decrease in a power supply voltage is accomplished).

The above first prior art or the above third prior art has the following problem. In addition to a conventional circuit for driving an MOS transistor element, it is required to provide a circuit for controlling the gate portion of the MOS transistor element $TR_2$ having a high gate threshold voltage $V_{th-H}$ in the first prior art, or, it is required to design a circuit for controlling the voltage of the channel forming region (well) individually corresponding to a logic circuit in the third prior art, and procedure in designing of an integrated circuit system is complicated.

On the other hand, in the above second prior art, the channel forming region and the source portion in the MOS transistor element formed in a silicon semiconductor substrate are forward-biased, and therefore, when a voltage of an input signal exceeds the forward voltage in a junction portion between the channel forming region and the source portion, the voltage of the input signal is clamped. That is, the problem is that the voltage of the input signal is clamped around 0.6 volt at the highest even if it is high. In other word, the problem is that the amplitude of the input signal is limited. Further, the second prior art also involves a problem that when the power supply voltage is close to the gate threshold voltage $V_{th}$, some MOS transistor elements may not operate due to temperature dependence on the gate threshold voltage $V_{th}$, a variation among production lots and an in-plane variation on a wafer. That is because the channel forming region is connected to the gate portion so that, essentially, the gate threshold voltage $V_{th}$ when the voltage between the gate portion and the source portion is, e.g., 0 volt cannot be controlled so as to be a desired value after the MOS transistor element is produced.

Generally, the gate threshold voltage $V_{th}$ of an MOS transistor element is defined by controlling an impurity concentration in a channel forming region. In general, impurity is introduced into the channel forming region by ion implantation. With an increase in the integration degree of an integrated circuit, design rule of an integrated circuit is further and further is decreased, and the absolute amount of the impurity atoms ion-implanted into the channel forming region decreases. In the ion implantation, essentially, the amount of the impurity atoms in ion implantation has a fluctuation. Therefore, the degree of fluctuation from an average value of an impurity concentration increases, and as a result, the variation in the gate threshold voltage $V_{th}$ of an MOS transistor element, caused by the above fluctuation, increases. In an integrated circuit having 1000000 transistor elements having a gate length of 0.1 $\mu$m, one simulation result shows that the variation in the gate threshold voltage $V_{th}$ is as large as 0.6 volt.

OBJECT AND SUMMARY OF THE INVENTION

It is therefore an object of the present invention to provide an insulated-gate field effect transistor which requires no special controlling circuit constitution individually corresponding to logic design and can operate at a low power supply voltage and which is free from an operation failure caused by temperature dependence on a gate threshold voltage $V_{th}$, a variation among production lots and an in-plane variation on a wafer and is capable of operating with a high speed, and a method of driving the same.

According to a first aspect of the present invention, the above object is achieved by an insulated-gate field effect transistor comprising;

(A) a channel forming region,
(B) source/drain regions formed in contact with the channel forming region, the source/drain regions being spaced from each other,
(C) a gate region formed on a gate insulation film formed on the surface of the channel forming region, the gate region and the channel forming region facing each other through the gate insulation film,
(D) a bias supplying means, and
(E) a capacitive element,
   wherein a potential for controlling a gate threshold voltage of the insulated-gate field effect transistor in an off-state thereof is applied to the channel forming region through the bias supplying means, and a signal having approximately the same phase as a phase of a signal supplied to the gate region is supplied to the channel forming region through the capacitive element.

According to a first aspect of the present invention, the above object is achieved by a method for driving an insulated-gate field effect transistor having;

(A) a channel forming region, (B) source/drain regions formed in contact with the channel forming region, the source/drain regions being spaced from each other, (C) a gate region formed on a gate insulation film formed on the surface of the channel forming region, the gate region and the channel forming region facing each other through the gate insulation film, (D) a bias supplying means, and (E) a capacitive element, the method comprising;

applying to the channel forming region through the bias supplying means a potential for controlling a gate threshold voltage of the insulated-gate field effect transistor in an off-state thereof, and supplying to the channel forming region through the capacitive element a signal having approximately the same phase as a phase of a signal supplied to the gate region.

In the insulated-gate field effect transistor according to the first aspect of the present invention, for reliably controlling the gate threshold voltage of the insulated-gate field effect transistor in an off-state, the potential applied to the channel forming region is preferably different from a potential applied to one source/drain region and is preferably different from a potential applied to the other source/drain region. In the method of driving the insulated-gate field effect transistor according to the first aspect of the present invention, for reliably controlling the gate threshold voltage of the insulated-gate field effect transistor in an off-state, the potential applied to the channel forming region is preferably different from a potential applied to one source/drain region and is preferably different from a potential applied to the other source/drain region.

According to a second aspect of the present invention, the above object is achieved by an insulated-gate field effect transistor comprising;

(A) a channel forming region having a first main surface and a second main surface, the first and second main surfaces facing each other, (B) source/drain regions formed in contact with the channel forming region, the source/drain regions being spaced from each other, (C) a first gate region formed on a first gate insulation film formed on the first main surface of the channel forming region, the first gate region and the channel forming region facing each other through the first gate insulation film, (D) a second gate region formed on a second gate insulation film formed on the second main surface of the channel forming region, the second gate region and the channel forming region facing each other through the second gate insulation film, (E) a bias supplying means, and (F) a capacitive element, wherein a predetermined potential is applied to the second gate region through the bias supplying means, and a signal having approximately the same phase as a phase of a signal supplied to the first gate region is supplied to the second gate region through the capacitive element.

According to a second aspect of the present invention, the above object is achieved by a method for driving an insulated-gate field effect transistor having;

(A) a channel forming region having a first main surface and a second main surface, the first and second main surfaces facing each other, (B) source/drain regions formed in contact with the channel forming region, the source/drain regions being spaced from each other, (C) a first gate region formed on a first gate insulation film formed on the first main surface of the channel forming region, the first gate region and the channel forming region facing each other through the first gate insulation film, (D) a second gate region formed on a second gate insulation film formed on the second main surface of the channel forming region, the second gate region and the channel forming region facing each other through the second gate insulation film, (E) a bias supplying means, and (F) a capacitive element, the method comprising;

applying a predetermined potential to the second gate region through the bias supplying means, and supplying to the second gate region through the capacitive element a signal having approximately the same phase as a phase of a signal supplied to the first gate region.

In the insulated-gate field effect transistor according to the second aspect of the present invention, the predetermined potential applied to the second gate region is preferably a potential for controlling a gate threshold voltage of the first gate region of the insulated-gate field effect transistor in an off-state thereof. Further, in the method of driving the insulated-gate field effect transistor according to the second aspect of the present invention, the predetermined potential applied to the second gate region is preferably a potential for controlling a gate threshold voltage of the first gate region of the insulated-gate field effect transistor in an off-state thereof.

In the insulated-gate field effect transistor or the method of driving the same according to the first aspect of the present invention, the "off-state" of the insulated-gate field effect transistor means a state where the insulated-gate field effect transistor is in an off-condition or in a stand-by state when no signal is supplied to the gate region or an off-signal is supplied to the gate region. In the insulated-gate field effect transistor or the method of driving the same according to the second aspect of the present invention, the "off-state" of the insulated-gate field effect transistor means a state where the insulated-gate field effect transistor is in an off-condition or in a stand-by state when no signal is supplied to the first gate region or an off-signal is supplied to the first gate region. A potential which is applied to the channel forming region or the second gate region for controlling the gate threshold voltage of the insulated-gate field effect transistor in an off-state or controlling the gate threshold voltage of the first gate region in an off-state will be referred to as "off-state potential $V_{OFF}$" for convenience hereinafter, and a signal supplied to the gate region or the first gate region will be referred to as "input signal" for convenience hereinafter. Further, a potential required for applying the off-state potential $V_{OFF}$ to the channel forming region or the second gate region through the bias supplying means will be referred to as "prescribed potential $V_{GGL}$" (including 0 volt). Further, the gate threshold voltage of the insulated-gate field effect transistor or the gate threshold voltage of the first gate region in an off-state will be generically simply referred to as "gate threshold voltage $V_{th\text{-}OFF}$" in some cases.

Since the above off-state voltage $V_{OFF}$ is properly determined, in other words, the prescribed potential $V_{GGL}$ can be properly set, the leakage current in the off-state of the insulated-gate field effect transistor can be decreased so as to be a desirable value or smaller. Further, the prescribed potential $V_{GGL}$ can be properly selected, which can reliably overcome the problem that some insulated-gate field effect transistors may not operate due to temperature dependence on the gate threshold voltage $V_{th\text{-}OFF}$, a variation among production lots or an in-plane variation on a wafer. Moreover, the variation in the gate threshold voltage, caused by the fluctuation in an impurity concentration in the channel forming region, can be minimized. For effectively preventing the variation among production lots and the in-plane variation on a wafer, it is preferred to control the potentials of the channel forming regions or the second gate regions, e.g., of $10^3$ to $10^4$ insulated-gate field effect transistors as one group out of $10^6$ insulated-gate field effect transistors.

The above prescribed potential $V_{GGL}$ can be determined as follows. In other insulated-gate field effect transistor having the same structure as that of an intended insulated-gate field effect transistor (channel width and/or channel length may be different) in one chip including the intended insulated-gate field effect transistor, a potential $V'_{GGL}$, with which obtained is an off-state potential $V_{OFF}$ in the channel forming region or the second gate region, required for bringing the gate threshold voltage of the other insulated-gate field effect transistor or the gate threshold voltage of the first gate region of the other insulated-gate field effect transistor into the predetermined gate threshold voltage $V_{th\text{-}OFF}$, is found first, and the obtained potential $V'_{GGL}$ is applied to one end of the bias supplying means of the intended insulated-gate field effect transistor as the prescribed $V_{GGL}$. Specifically, prescribed potential $V_{GGL}$ can be easily generated in an integrated circuit, e.g., according to the method disclosed in JP-B-50-14508, and differing from a conventional technology, respective controlling circuits which require respective designs depending upon respective logic designs are not required and the designing of its circuit is easy. According to the technology disclosed in the above JP-B-50-14508, there are separately prepared a circuit for detecting the gate threshold voltage of an insulated-gate field effect transistor or the gate threshold voltage of the first gate region of an insulated-gate field effect transistor which is a reference in one chip including the intended insulated-gate field effect transistor, and a differential amplification circuit which operates so as to bring a difference between the output of the above detection circuit and a desirable gate threshold voltage $V_{th\text{-}OFF}$ into close to zero, and the channel forming region or the second gate region of the insulated-gate field effect transistor which can be a reference is biased with the output of the above differential amplification circuit, and further, the output is applied to one end of the bias supplying means as a prescribed potential $V_{GGL}$.

In the insulated-gate field effect transistor or the method of driving the same according to the first aspect of the present invention, a signal having approximately the same phase as the phase of an input signal $V_{IN}$ supplied to the gate region is supplied to the channel forming region through the capacitive element of the insulated-gate field effect transistor, to the gate region of which the input signal $V_{IN}$ is being supplied for bringing the insulated-gate field effect transistor into on-state, so that the channel forming region of the n-channel type insulated-gate field effect transistor has a certain potential higher than the off-state potential $V_{OFF}$, or, so that the channel forming region of the p-channel type insulated-gate gate field effect transistor has a certain potential lower than the off-state potential $V_{OFF}$. In the insulated-gate field effect transistor or the method of driving the same according to the second aspect of the present invention, a signal having approximately the same phase as the phase of an input signal $V_{IN}$ supplied to the first gate region is supplied to the second gate region through the capacitive element of the insulated-gate field effect transistor, to the first gate region of which the input signal $V_{IN}$ is being supplied for bringing the insulated-gate field effect transistor into on-state, so that the first gate region of the n-channel type insulated-gate field effect transistor has a certain potential higher than the off-state potential $V_{OFF}$, or, so that the channel forming region of the p-channel type insulated-gate field effect transistor has a certain potential lower than the off-state potential $V_{OFF}$. These certain potentials will be referred to as "on-state potential $V_{on}$" for convenience.

As the consequence of the above, the gate threshold voltage $V_{th\text{-}ON}$ of the gate region or the first gate region for bringing the insulated-gate field effect transistor into an on-state decreases, and the insulated-gate field effect transistor can be operated at a low power supply voltage with a high speed. Even in a case when the voltage of an input signal supplied to the gate region or the first gate region exceeds the forward voltage of a junction portion between the channel forming region and the source/drain region, the input impedance of the insulated-gate field effect transistor, seen from an input terminal, decreases only by a capacitance of the capacitive element, and there is caused no problem that the voltage of an input signal is clamped as discussed concerning the second prior art, i.e., that the amplitude of the input signal is limited.

In the present embodiment, a signal supplied to the gate region or the first gate region is referred to as "signal A" for convenience, and a signal supplied to the channel forming region or the second ate region through the capacitive element is referred to as "signal B" for convenience. That the signal B has approximately the same phase as that of the signal A means that the amplitude and the potential of the signal B may be different from those of the signal A, or that the phase of the signal B may deviate from the phase of the signal A to some extent. Preferably, the phase of the signal B is forwarded within a time of a pulse width as compared with the phase of the signal A, since it is preferable for a higher speed operation for the gate threshold voltage to be changed from $V_{th\text{-}OFF}$ to $V_{th\text{-}ON}$ in advance.

The most simplest method for supplying a signal having approximately the same phase to the channel forming region or the second gate region through the capacitive element is a method in which one end of the capacitive element is connected to the channel forming region or the second gate region and the other end of the capacitive element is connected to the gate region or the first gate region, while one of other terminals which output a signal having approximately the same phase as that of a signal supplied to the gate region or the first gate region may be connected to the other end of the capacitive element.

The resistance value of the bias supplying means is required to be large to such an extent that the attenuating of the voltage of an input signal supplied to the channel forming region or the second gate region through the capacitive element can be prevented. When the resistance value is too small, coupling of the input signal with the channel forming region or the second gate region is small and a time constant determined by the bias supplying means and the capacitive element is also too small for a proper operation. When the resistance value is 0, no potential change occurs even if a signal is inputted through the capacitive element. On the other hand, the resistance component (parallel equivalent resistance value) of the capacitive element is required to be sufficiently larger than the resistance value of the bias supplying means. The time constant determined by the bias supplying means and the capacitive element is required to be larger than the rising time of a pulse signal supplied to the gate region or the first gate region. The time constant may be greater than, equal to or smaller than the pulse width of an input signal, and may be determined on the basis of those characteristics which the insulated-gate field effect transistor is required to have.

In the insulated-gate field effect transistor or the method of driving the same according to the first aspect of the present invention, the bias supplying means may be a resistive element formed in an extended region of the channel forming region. In the insulated-gate field effect transistor or the method of driving the same according to the second aspect of the present invention, the bias supplying means may be a resistive element formed in an extended region of the second gate region. When the bias supplying means is a resistive element, the bias supplying means can be simplified in constitution, and the bias is stabilized. Specifically, the above resistive element includes a semiconductor substrate surface region doped with an impurity, a semiconductor thin film in an SOI structure and a thin-film resistor of polysilicon, or the like.

In the insulated-gate field effect transistor or the method of driving the same according to the first aspect of the present invention, the bias supplying means can be a transistor element having a gate portion, a channel forming portion and source/drain portions, and preferably, a potential (i.e., a prescribed potential $V_{GGL}$) to generate, at one source/drain portion, the potential (off-state potential $V_{OFF}$) for controlling the gate threshold voltage $V_{th\text{-}OFF}$ of the insulated-gate field effect transistor in an off-state thereof is applied to the other source/drain portion. In view of the simplification of a constitution, it is preferred to form the transistor element in an extended region of the channel forming region. The conductivity type of a channel to be induced in the surface of the channel portion of the transistor element (to be referred to as "channel of transistor element" hereinafter) may be the same as the conductivity type of a channel to be induced in the surface of the channel forming region of the insulated-gate field effect transistor (to be referred to as "channel of insulated-gate field effect transistor" hereinafter), particularly in the case of a depletion type SOI transistor element, or may be opposite thereto. When the conductivity type of the channel of the transistor element is arranged to be opposite to the conductivity type of the channel of the insulated-gate field effect transistor, the resistance value of the bias supplying means changes to increase with a signal having approximately the same phase as that of a signal (input signal) and being supplied to the gate portion of the transistor element, and a desired CR time constant required for desirable operation can be attained with a small capacitive element. In spite of this, any signal or constant potential may be supplied to the gate portion of the transistor element, while it is preferred to supply a signal having approximately the same phase as that of a signal (input signal) supplied to the gate region of the insulated-gate field effect transistor. When the conductivity type of the channel of the transistor element is arranged to be the same as that of the channel of the insulated-gate field effect transistor, the resistance value of the bias supplying means changes to increase with a signal having an approximately reverse phase to the phase of a signal (input signal) and being supplied to the gate portion of the transistor element, and a desired CR time constant required for desirable operation can be attained with a small capacitive element.

Further, in the insulated-gate field effect transistor or the method of driving the same according to the second aspect of the present invention, the bias supplying means is preferably a transistor element having a gate portion, a channel forming portion and source/drain portions, and preferably, a potential (i.e., prescribed potential $V_{GGL}$) to generate, at one source/drain portion, the potential (off-state potential $V_{OFF}$) for controlling the gate threshold voltage $V_{th\text{-}OFF}$ of the first gate region of the insulated-gate field effect transistor in an off-state thereof is applied to the other source/drain portion. In this case, it is preferred to form the transistor element in an extended region of the second gate region in view of the simplification of a constitution. The conductivity type of a channel of the transistor element may be the same as, or opposite to, the conductivity type of the channel of the insulated-gate field effect transistor. When the conductivity type of the channel of the transistor element is opposite to the conductivity type of the channel of the insulated-gate field effect transistor, the resistance value of the bias supplying means changes to increase with a signal having approximately the same phase as that of a signal (input signal) and being supplied to the gate portion of the transistor element, and a desired CR time constant required for desirable operation can be attained with a small capacitive element. In spite of this, any signal or constant potential may be supplied to the gate portion of the transistor element, while it is preferred to supply a signal having approximately the same phase as that of a signal (input signal) supplied to the first gate region of the insulated-gate field effect transistor. When the conductivity type of the channel of the transistor element is arranged to be the same as that of the channel of the insulated-gate field effect transistor, the resistance value of the bias supplying means changes to increase with a signal having an approximately reverse phase to the phase of a signal (input signal) and being supplied to the gate portion of the transistor element, and a desired CR time constant required for desirable operation can be attained with a small capacitive element.

When the bias supplying means is formed of a transistor element as described above, the time constant determined by the bias supplying means and the capacitive element can be controlled. Or, in some cases, the bias supplying means can be in a high resistance state, and in other cases, the bias supplying means can be in a low resistance state, whereby the operation of the insulated-gate field effect transistor with regard to an input signal supplied to the gate region or the first gate region can be controlled. That is, the insulated-gate field effect transistor can be controlled so as to respond to an input signal supplied to the gate region or the first gate region and so as not to respond to another input signal supplied to the gate region or the first gate region. Or, the insulated-gate field effect transistor can be controlled so as to respond to an input signal having a large transition time by bringing the transistor element into an on-state first to charge the channel forming region or the second gate region and then bringing the transistor element into an off-state just before the transition. When the bias supplying means is formed of a diode, in some cases, particularly in the insulated-gate field effect transistor or the method of driving the same according to the first aspect of the present invention, the off-state potential $V_{OFF}$ applied to the channel forming region or the second gate region may become unstable or a latch-up may be liable to occur.

In the insulated-gate field effect transistor or the method of driving the same according to the first aspect of the present invention, the capacitive element preferably has a first conductive region (for example, formed of an extended region of the gate region), a second conductive region (for example, formed of an extended region of the channel forming region), and a dielectric film sandwiched between the first conductive region and the second conductive region. The above dielectric film is preferably formed of an extended region of the above gate insulation film in view of the simplification of a constitution. Alternatively, the capacitive element is preferably formed of a junction capacitor. The junction capacitor includes a pn junction which is not deeply forward-biased and a Schottky junction.

In the insulated-gate field effect transistor or the method of driving the same according to the second aspect of the present invention, the capacitive element preferably has a first conductive region, a second conductive region, and a dielectric film sandwiched between the first conductive region and the second conductive region, the first conductive region is preferably formed of an extended region of the first gate region, and the second conductive region is preferably formed of an extended region of the second gate region. The above dielectric film is preferably formed of an extended region of the second gate insulation film in view of the simplification of a constitution. Further, the dielectric film can be simultaneously formed when the first gate insulation film is formed. Further, preferably, a conductive region as an electrode of the capacitive element is formed between the first conductive region and the dielectric film, and the conductive region is preferably connected with the first conductive region through a contact plug. Alternatively, the capacitive element is preferably formed of a junction capacitor. The junction capacitor includes a pn junction which is not deeply forward-biased and a Schottky junction.

In the insulated-gate field effect transistor or the method of driving the same according to the first or second aspect of the present invention, the channel forming region and the source/drain regions may be formed in a semiconductor substrate, while it is preferred to form these on an insulation layer formed on a support substrate. The latter formation can be attained by the application of a so-called SOI technique.

BRIEF DESCRIPTION OF THE DRAWINGS

The insulated-gate field effect transistor and the method of driving the same, provided by the present invention, will be explained with reference to drawings hereinafter, while the present invention shall not be limited to these Examples.

DESCRIPTION OF THE PREFERRED EMBODIMENTS

EXAMPLE 1

Figure 1A:
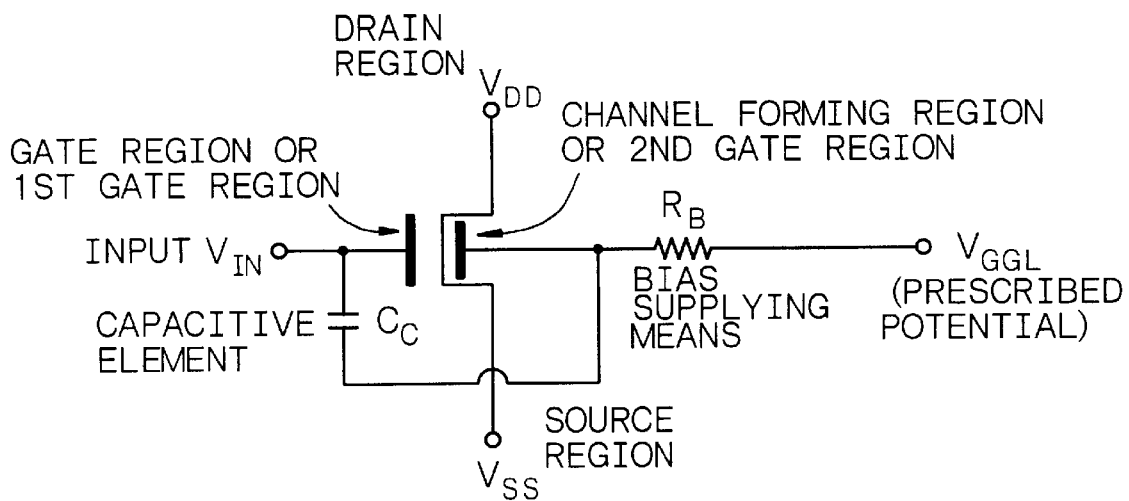
FIGS. 1A and 1B respectively show the equivalent circuits of the insulated-gate field effect transistors of the present invention.

In Example 1, the operation characteristics of the insulated-gate field effect transistor of the present invention will be explained with reference to the equivalent circuit shown in FIG. 1A. In the insulated-gate field effect transistor in Example 1 shown in FIG. 1A, the other end of the capacitive element is connected to the gate region (or the first gate region).

The resistance value of the bias supplying means is $R_B$, and the capacitance of the capacitive element is $C_C$. Further, a capacitance $C_B$ is a total of the capacitance between the channel forming region and the channel (or the capacitance between the second gate region and the channel forming region) and the capacitance between the channel forming region (or the second gate region) and the drain region, the source region and other region. Further, α is a proportion of a signal supplied to the channel forming region (or the second gate region) through the capacitive element to an input signal.

An increment $\Delta I_{ds}$ of a driving current $I_{ds}$ of the insulated-gate field effect transistor of the present invention can be expressed by the following equation (1). Variables in the equation (1) are defined as follows.

$V_{IN}$: voltage of an input signal supplied to the gate region (or the first gate region).

$V_{th-OFF}$: gate threshold voltage (or gate threshold voltage of the first gate region) when the insulated-gate field effect transistor is in an off-state (stationary state).

$V_{DD}$: power supply voltage applied through a load transistor to the drain region of the insulated-gate field effect transistor.

β: $(W/L)\mu C_{ox}$ in which W is width of the channel, L is length of the channel, μ is mobility of electron, $C_{ox}$ is a capacitance per unit area of the gate insulation film (or the first gate insulation film).

$$\Delta I_{ds} = (\beta/2)\{-(V_{IN} - V_{th-OFF})^2 + (V_{IN} - V_{th-OFF} + \alpha\gamma V_{IN})^2\} \quad (1)$$
$$= (\beta/2)\{\alpha\gamma V_{IN}(2V_{IN} - 2V_{th-OFF} + \alpha\gamma V_{IN})\}$$
$$\leq (\beta/2)\{\alpha\gamma V_{DD}(2V_{DD} - 2V_{th-OFF} + \alpha\gamma V_{DD})\}$$

where γ is given as a ratio of a change amount $\Delta V_{th}$ ($=V_{th-ON}-V_{th-OFF}$) of the gate threshold voltage seen from the gate region (or the first gate region) to the voltage change of the channel forming region (or the second gate region) $\Delta V_{ch}(=V_{ON}-V_{OFF})$, as shown in the following equation (2). And, α is expressed by the following equation (3).

$$\Delta V_{th} = \gamma \Delta V_{ch} \quad (2)$$
$$\alpha = C_B/(C_C+C_B) \quad (3)$$

When $V_{DD}$=1.0 volt, $V_{th-OFF}$=0.4 volt, γ=0.4 and α=0.5, then $\Delta I_{ds}/I_{ds} \leq 0.78$. That is, when $V_{DD}$=1.0 volt, the operation speed of the insulated-gate field effect transistor can be increased by 78%. On the other hand, the power supply voltage of scant 0.8 volt is sufficient for attaining the same operation speed, and the power consumption can be decreased to about 60%. The ratio of the above improvement in power consumption increases as the power supply voltage $V_{DD}$ comes close to $V_{th-OFF}$. The time constant determined by ($C_C+C_B$) and $R_B$ is required to be larger than the transition time of an input signal (rising time of a pulse signal). The time constant may be greater than, equal to or smaller than the pulse width of a signal (input signal). The above improvement is attained when the load capacitance of input/output from a wiring, etc is large as compared with the capacitance of the channel forming region or when the channel forming region is formed in an SOI structure and the capacitance itself of the channel forming region is small.

Figure 2A:
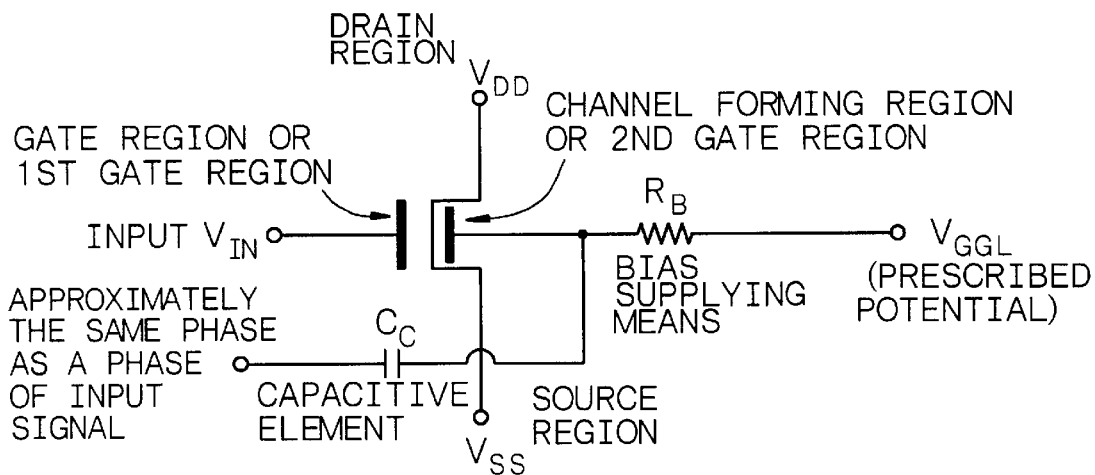
FIGS. 2A and 2B respectively show other embodiments of the equivalent circuits of the insulated-gate field effect transistors of the present invention.

The insulated-gate field effect transistor explained in Example 1 has a structure in which the other end of the capacitive element is directly connected to the gate region (or the first gate region), while the "other end" of the capacitive element is not necessarily required to be directly connected to the gate region (or the first gate region). As shown in FIG. 2A, generally, the insulated-gate field effect transistor of the present invention accomplishes the same function and the same effect when a signal having approximately the same phase as that of an input signal inputted to the gate region (or the first gate region) is inputted to the other end of the capacitive element. In particular, in the insulated-gate field effect transistor or the method of driving the same according to the second aspect of the present invention, the insulated-gate field effect transistor can be structurally simplified and the number of steps of its manufacturing can be decreased when an output portion of a circuit (e.g., a drain region of the transistor on a second main surface side) at a stage with an odd number before the insulated-gate field effect transistor and the second gate region are connected to each other through the capacitive element.

EXAMPLE 2

Figure 3A:
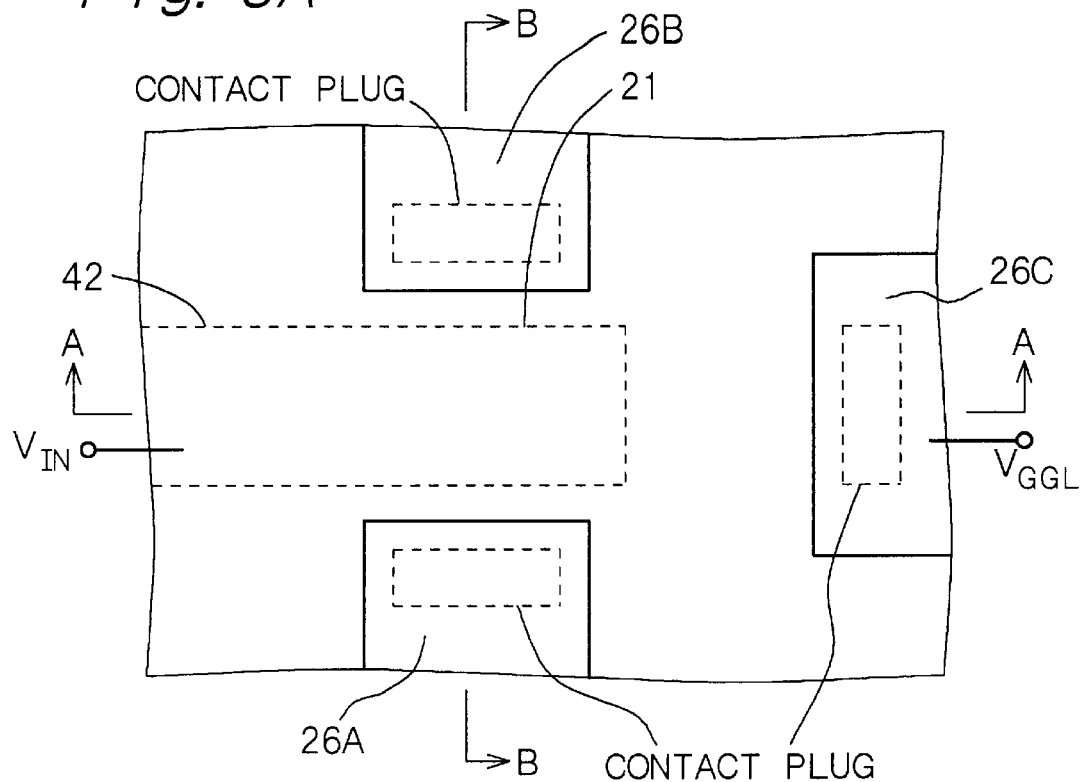
FIGS. 3A and 3B show schematic layouts of elements of an insulated-gate field effect transistor in Example 2.
Figure 3B:
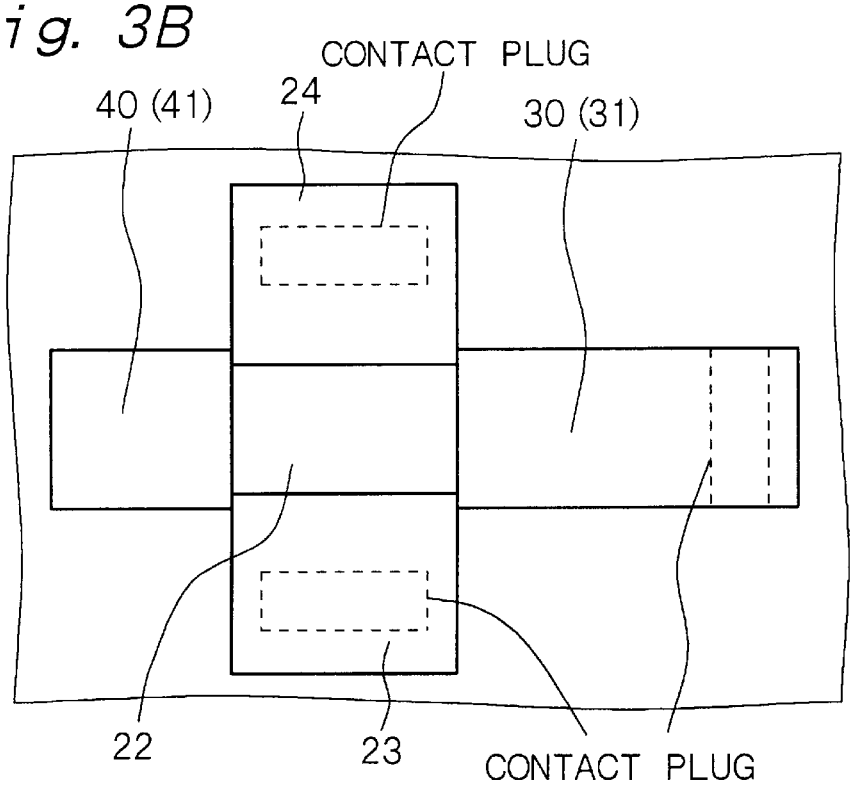
Figure 4A:
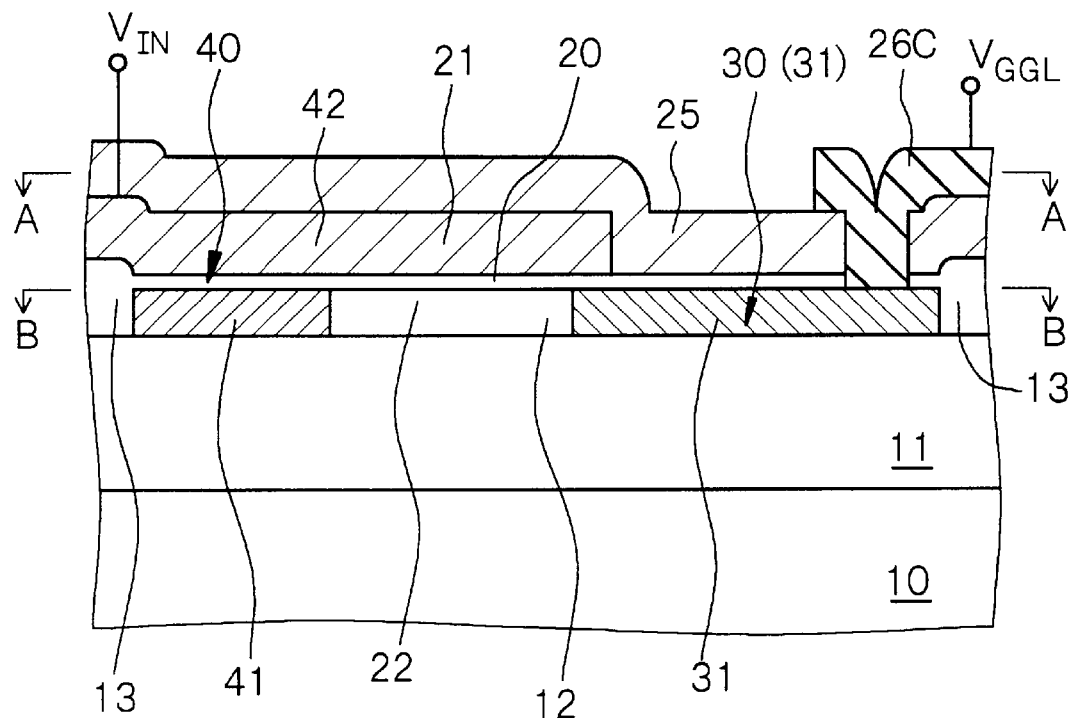
FIGS. 4A and 4B show schematic partial cross-sectional views of the insulated-gate field effect transistor in Example 2.
Figure 4B:
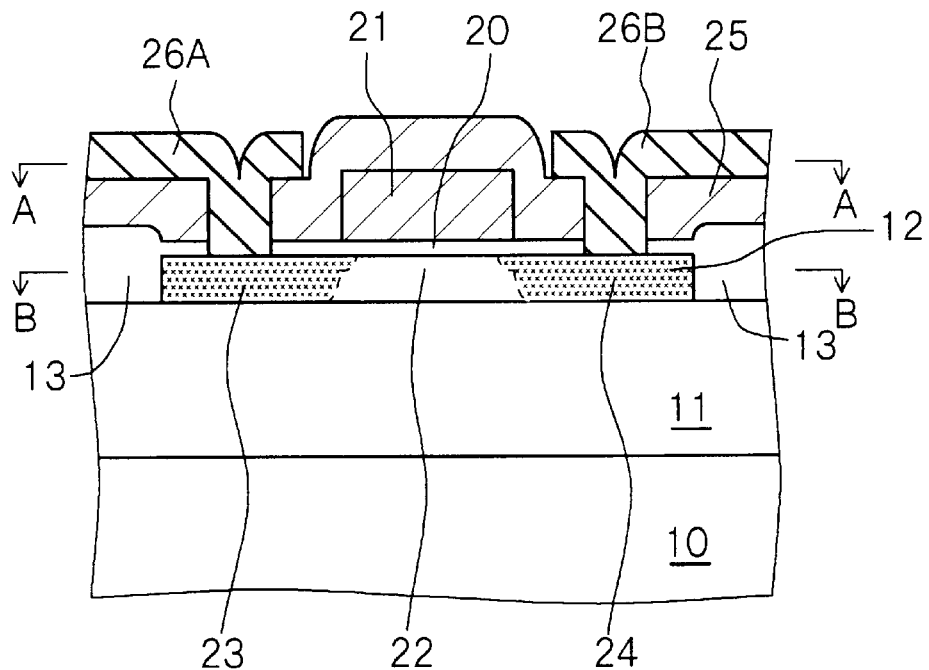

Example 2 is concerned with the insulated-gate field effect transistor and the method of driving the same according to the first aspect of the present invention. FIGS. 3A and 3B respectively show schematic layouts of constituent elements of an insulated-gate field effect transistor in Example 2, and FIGS. 4A and 4B show schematic partial cross-sectional views thereof. FIGS. 4A and 4B are schematic partial cross-sectional views taken along arrows A—A and B—B in FIG. 3A. FIGS. 3A and 3B are schematic layouts along arrows A—A and B—B in FIGS. 4A and 4B.

The insulated-gate field effect transistor in Example 2 is composed of a channel forming region 22, a source region 23, a drain region 24, a gate region 21, a bias supplying means 30 and a capacitive element 40. The source region 23 and the drain region 24 are formed in contact with the channel forming region 22 and are spaced from each other. The gate region 21 faces the channel forming region 22 through a gate insulation film 20, and the channel forming region 22 is formed between the source region 23 and the drain region 24. In Example 2, the bias supplying means 30 is composed of a resistive element formed in an extended region of the channel forming region 22. Specifically, it is composed of a semiconductor region 31 doped with an impurity. The concentration of the impurity in the semiconductor region 31 is lower than that of the source/drain regions 23 and 24. Further, the capacitive element 40 is composed of a first conductive region 42 formed of an extended region of the gate region 21, a second conductive region 41 formed of an extended region of the channel forming region 22 and a dielectric film sandwiched between the first conductive region 42 and the second conductive region 41. Further, the dielectric film is composed of an extended region of the gate insulation film 20. The above first conductive region 42 and the above second conductive region 41 correspond to electrodes of a capacitor, and the gate insulation film 20 corresponds to a dielectric film of the capacitor. Further, the channel forming region 22, the source region 23 and the drain region 24 are formed on an insulation layer 11. The insulation layer 11 is formed on a support substrate 10.

In the insulated-gate field effect transistor and the method of driving the same in Example 2, a potential (off-state potential $V_{OFF}$) for controlling the gate threshold voltage $V_{th-OFF}$ of the insulated-gate field effect transistor in an off-state is applied to the channel forming region 22 through the bias supplying means 30. Moreover, a signal having approximately the same phase as that of an input signal supplied to the gate region 21 is supplied to the channel forming region 22 through the capacitive element 40. That is, the channel forming region 22 is connected to a prescribed potential $V_{GGL}$ through the bias supplying means 30, and moreover, the channel forming region 22 is connected to the second conductive region 41 which is one end of the capacitive element 40. On the other hand, the first conductive region 42 which is the other end of the capacitive element 40 is connected to the gate region 21. In other words, the channel forming region 22 is coupled with the gate region 21 through the capacitive element 40.

In the insulated-gate field effect transistor and the method of driving the same in Example 2, the gate threshold voltage $V_{th\text{-}OFF}$ of the insulated-gate field effect transistor in an off-state is determined by the prescribed potential $V_{GGL}$. That is, since the channel forming region 22 is connected to the prescribed potential $V_{GGL}$ through the bias supplying means 30, the channel forming region 22 has an off-state potential $V_{OFF}$. By properly setting the off-state potential $V_{OFF}$, in other words, by properly selecting the above prescribed potential $V_{GGL}$, the leakage current of the insulated-gate field effect transistor in an off-state can be controlled so as to be equal to, or smaller than, a desirable value. Further, since the prescribed potential $V_{GGL}$ can be properly selected, there can be reliably avoided the problem that some insulated-gate field effect transistors do not operate due to temperature dependence on the gate threshold voltage $V_{th\text{-}OFF}$, a variation among production lots or an in-plane variation on a wafer. Furthermore, the variation in the gate threshold voltage $V_{th\text{-}OFF}$, caused by the fluctuation in impurity concentration of the channel forming region, can be minimized.

The channel forming region 22 is coupled with the gate region 21 through the capacitive element 40, and when the insulated-gate field effect transistor is going to be driven into an on-state, a signal having approximately the same phase as that of an input signal $V_{IN}$ supplied to the gate region 21 is supplied to the channel forming region 22 through the capacitive element 40. The channel forming region 22 therefore has an on-state potential $V_{ON}$ ($V_{ON}$>$V_{OFF}$ in n channel type and $V_{ON}$<$V_{OFF}$ in p channel type). As a result, the gate threshold voltage $V_{th\text{-}ON}$ seen from the gate region 21 decreases and the insulated-gate field effect transistor can be operated at a low power supply voltage with a high speed. In the insulated-gate field effect transistor shown in FIGS. 3A, 3B, 4A and 4B, it is required to form a contact plug (not shown) in the first conductive region 42 extending from the gate region 21, for supplying a signal (input signal) to the gate region 21. Therefore, when the capacitive element 40 is provided below the above contact plug, the area of the insulated-gate field effect transistor is not so larger than that of a conventional one.

The method of manufacturing the insulated-gate field effect transistor in Example 2 will be explained with reference to FIGS. 5A, 5B, 6A, 6B, 7A, 7B, 8A and 8B hereinafter. FIGS. 5A, 6A, 7A and 8A show schematic partial cross-sectional views as taken along arrows A—A in FIG. 3A, and FIGS. 5B, 6B, 7B and 8B show schematic partial cross-sectional views as taken along arrows B—B in FIG. 3B.

Step-200

First, the insulation layer 11 formed, e.g., of $SiO_2$ and the silicon layer 12 are formed on the support substrate 10 formed, e.g., of a silicon semiconductor substrate. The above structure can be formed by any known method such as a bonding SOI method, or an SIMOX method in which heat treatment is carried out after a silicon semiconductor substrate is ion-implanted with oxygen. Alternatively, the silicon layer 12 can be formed by depositing an amorphous silicon layer or a polysilicon layer on the insulation layer 11 by a CVD method and then carrying out any one of various known single-crystallization methods such as a zone melting crystallization method using a laser beam or an electron beam, a lateral solid phase crystal growth method in which crystal growth is carried out thorough an opening portion formed in the insulation layer 11, and the like. Then, the silicon layer 12 is selectively oxidized to form a so-called field oxide film 13, while leaving a region where the insulated-gate field effect transistor including the bias supplying means 30 and the capacitive element 40 is to be formed.

Step-210

Figure 5A:
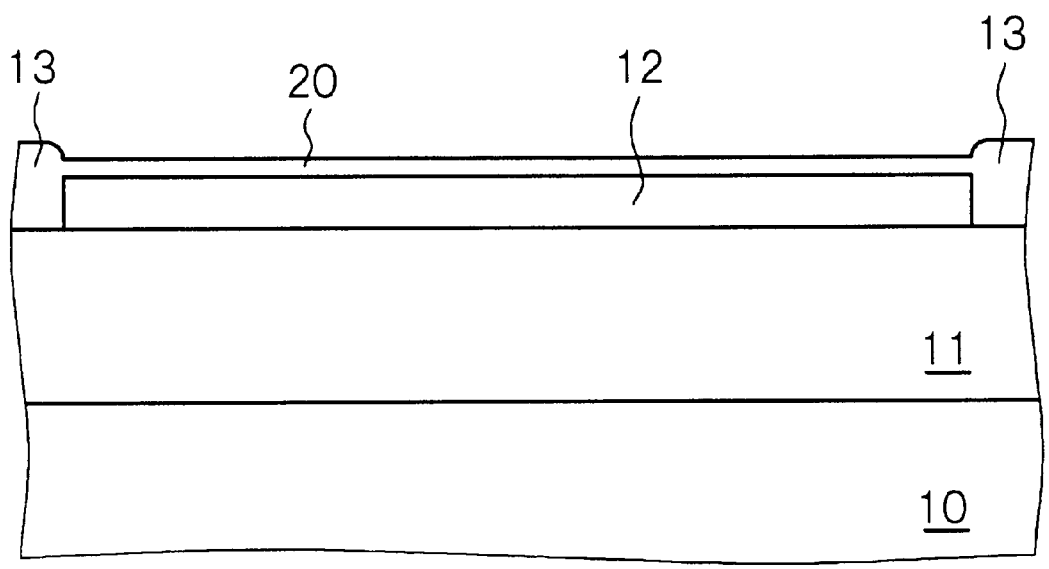
FIGS. 5A and 5B show schematic partial cross-sectional views of a support substrate, etc., for explaining the process for manufacturing the insulated-gate field effect transistor in Example 2.
Figure 5B:
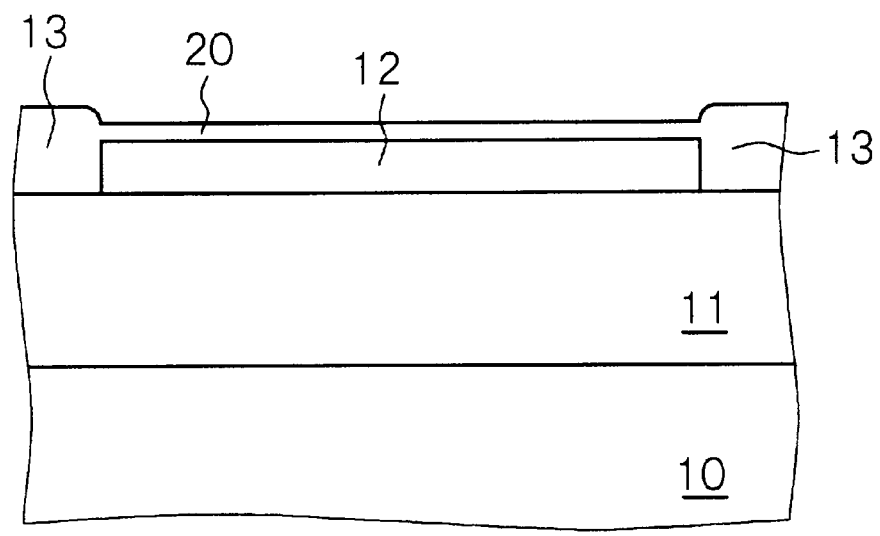
Figure 6A:
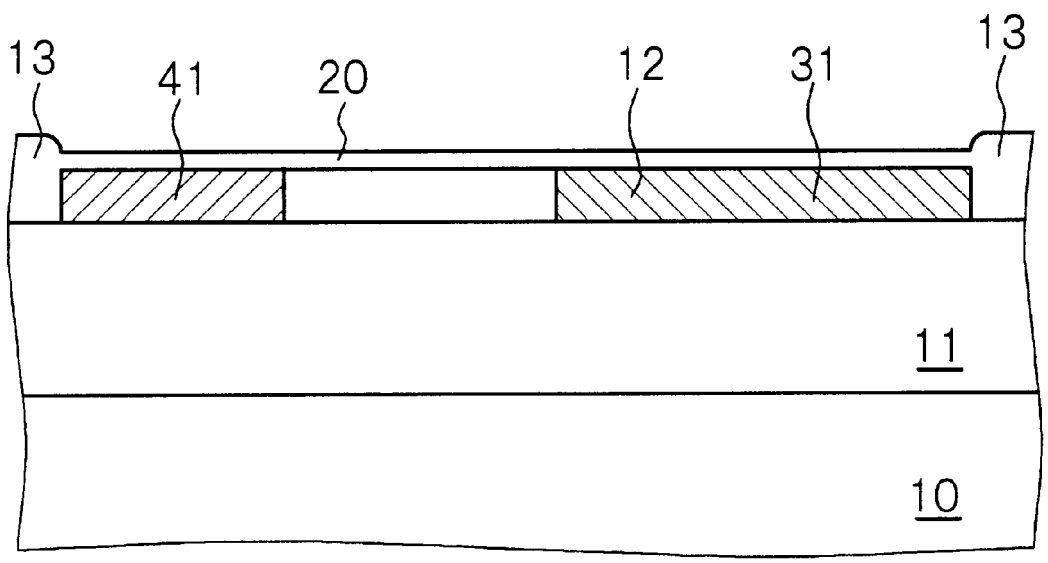
FIGS. 6A and 6B, subsequent to FIGS. 5A and 5B, show schematic partial cross-sectional views of a support substrate, etc., for explaining the process for manufacturing the insulated-gate field effect transistor in Example 2.
Figure 6B:
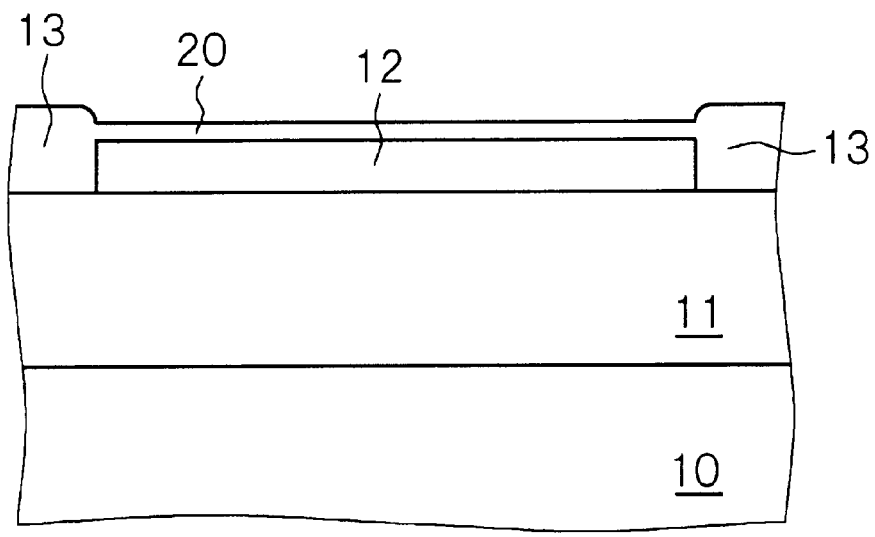

Then, the surface of the silicon layer 12 is oxidized by a thermal oxidation method, to form the gate insulation film 20 on the surface of the silicon layer 12 (see FIGS. 5A and 5B). The above gate insulation film 20 works as a so-called gate oxide film and at the same time works as a dielectric film of the capacitive element 40. In a separate step, an insulation film which works as a dielectric film of the capacitive element 40 can be formed separately from the gate insulation film which works as a so-called gate oxide film. Further, a field oxide film may be formed in the silicon layer 12 between a region where the channel forming region is to be formed and a region where the capacitive element is to be formed.

Step-220

Then, the silicon layer 12 is ion-implanted with an impurity for forming the semiconductor region 31 which is the bias supplying means 30 formed of a resistive element. The dose of the impurity in the above ion implantation can be set such that a desirable resistance value of the bias supplying means 30 is obtained. On the other hand, the silicon layer 12 is ion-implanted with a high concentration of an impurity for forming the second conductive region 41 which constitutes the capacitive element 40. In this manner, a structure shown in FIGS. 6A and 6B can be obtained. The ion implantation order for forming the above regions is essentially determined arbitrarily, and the ion implantation can be carried out before the formation of the gate insulation film in Step-210.

Step-230

Figure 7A:
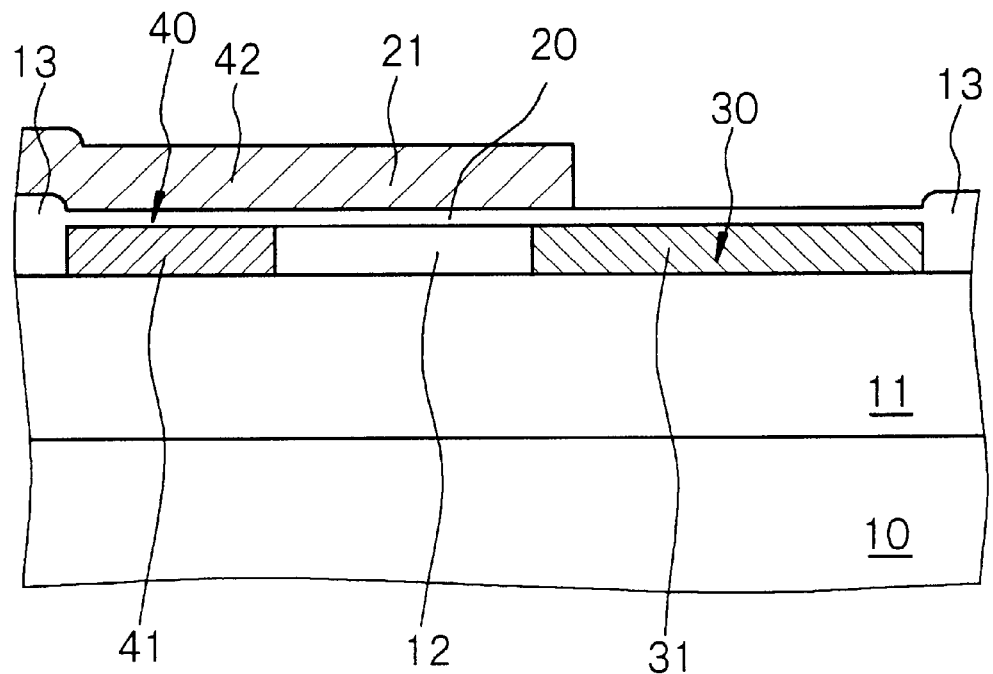
FIGS. 7A and 7B, subsequent to FIGS. 6A and 6B, show schematic partial cross-sectional views of a support substrate, etc., for explaining the process for manufacturing the insulated-gate field effect transistor in Example 2.
Figure 7B:
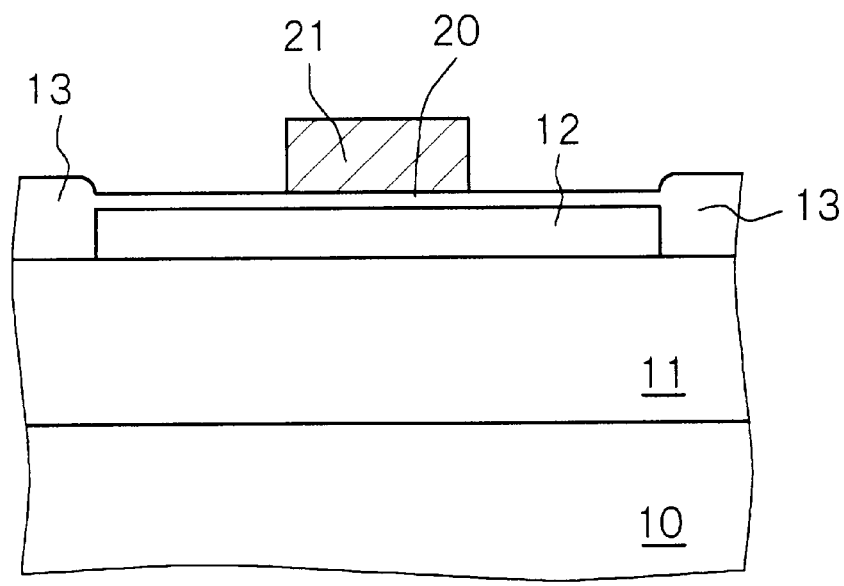
Figure 8A:
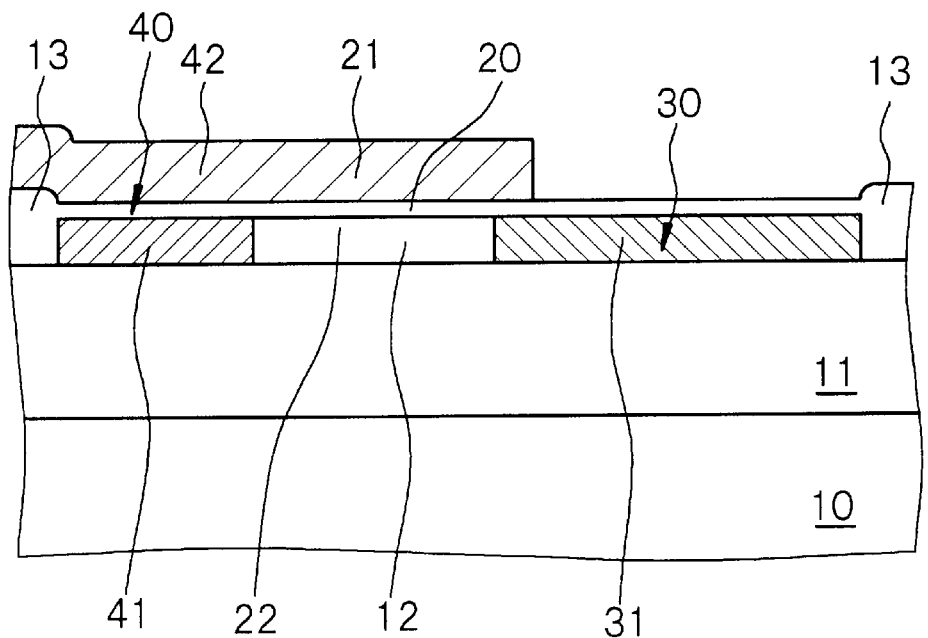
FIGS. 8A and 8B, subsequent to FIGS. 7A and 7B, show schematic partial cross-sectional views of a support substrate, etc., for explaining the process for manufacturing the insulated-gate field effect transistor in Example 2.
Figure 8B:
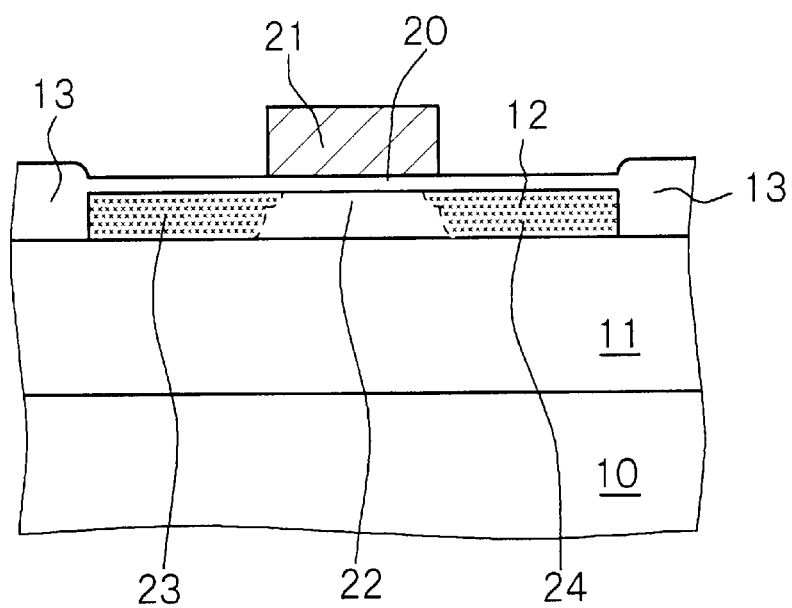

Then, a polysilicon layer doped with an impurity is deposited on an entire surface by a CVD method, and the polysilicon layer is patterned to form the gate region 21 and the first conductive region 42 which is an extended region of the gate region 21 which constitutes the capacitive element 40 (see FIGS. 7A and 7B). The gate region 21 and the first conductive region 42 may be composed of a polycide layer formed of a polysilicon layer and a silicide layer such as $TiSi_2$, WSi, $CoSi_2$ or a bi-layered structure formed of a polysilicon layer and a tungsten layer, in place of a polysilicon layer.

Step-240

Then, regions of the silicon layer 12 where the source region and the drain region of the insulated-gate field effect transistor are to be formed are ion-implanted with an impurity, for forming an LDD structure, and then an $SiO_2$ layer is deposited on the entire surface by a CVD method. The so-formed $SiO_2$ layer is etched back to form side walls (not shown) on the side surfaces of the gate region 21 and the first conductive region 42. Then, the silicon layer 12 is ion-implanted with an impurity and annealed for activation, and the channel forming region 22, the source region 23 and the drain region 24 are formed in the silicon layer 12 (see FIGS. 8A and 8B). In Step-220, an impurity may be ion-implanted into a region of the silicon layer 12 near the interface of the insulation layer 11, as required, for forming a region having a high impurity concentration at the bottom of the channel forming region 22.

Then, an insulating interlayer 25 composed, e.g., of $SiO_2$ is deposited on an entire surface by a CVD method, and contact openings are formed in the insulating interlayer 25 on the source region 23 and the drain region 24 by an RIE method. Further, a contact opening is also formed on the other end portion of the semiconductor region 31. An aluminum alloy layer is deposited on an entire surface including inner surfaces of the contact openings, e.g., by a sputtering method, and the aluminum alloy layer is patterned to form wirings 26A, 26B and 26C. In the above manner, an insulated-gate field effect transistor having the structure shown in FIGS. 3A, 3B, 4A and 4B can be produced. Alternatively, the contact openings may be filled with tungsten, e.g., by a blanket tungsten method to form contact plugs composed of tungsten inside the contact openings, and then an aluminum alloy layer may be deposited on the insulating interlayer 25, e.g., by a sputtering method.

EXAMPLE 3

Figure 9A:
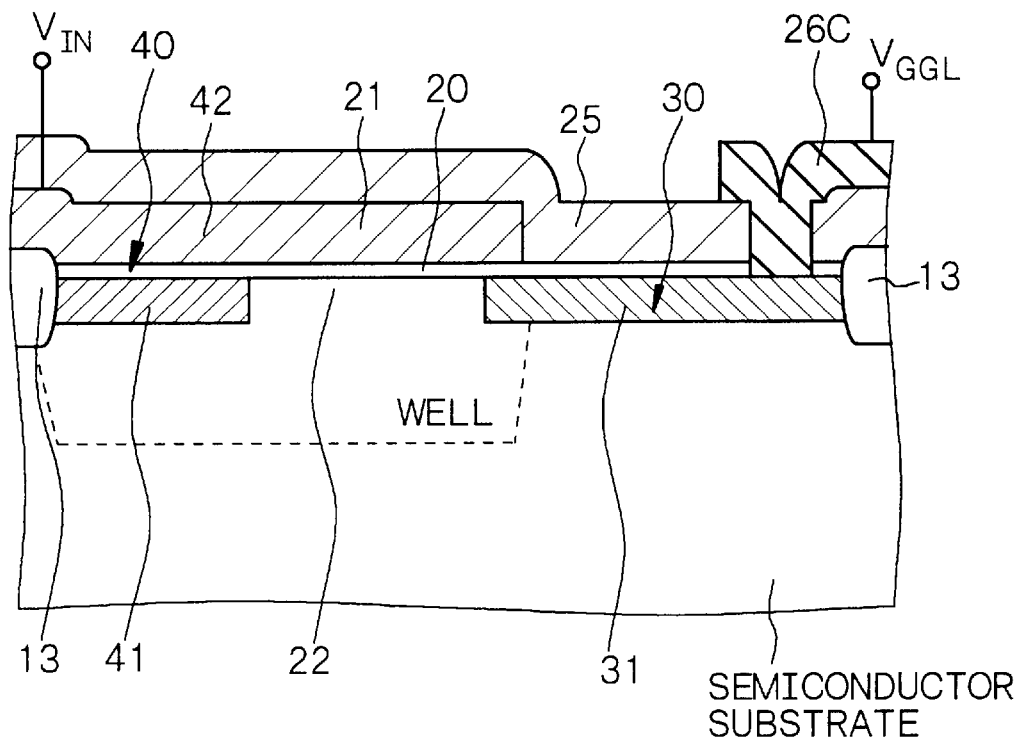
FIGS. 9A and 9B show schematic partial cross-sectional views of an insulated-gate field effect transistor in Example 3.
Figure 9B:
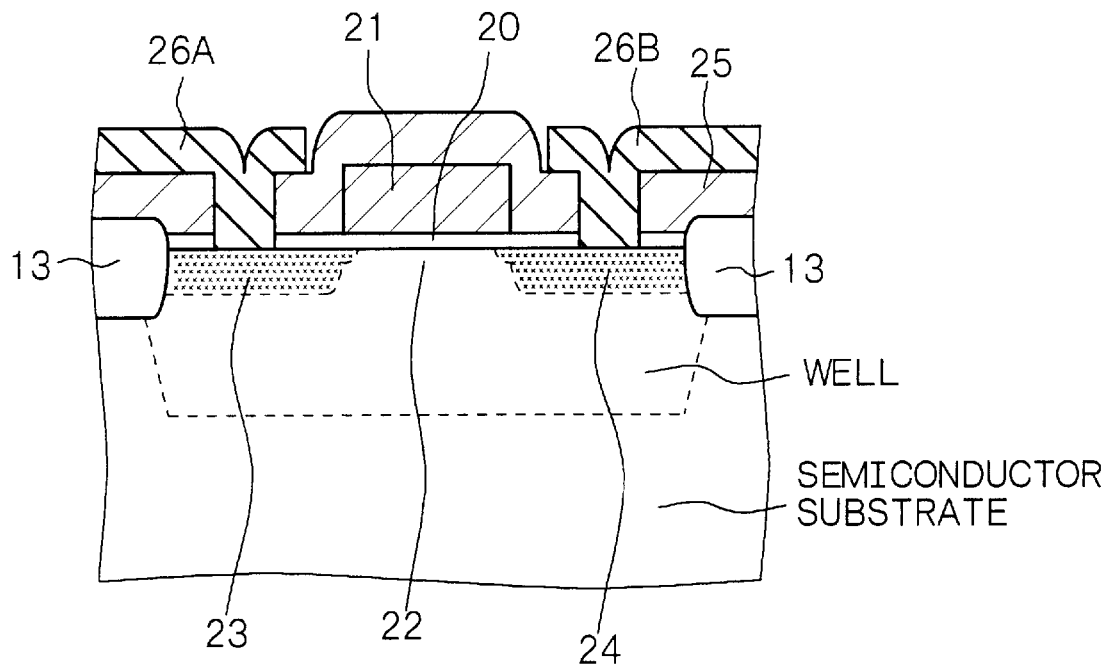

Example 3 is directed to a variant of the insulated-gate field effect transistor in Example 2. The insulated-gate field effect transistor in Example 2 has a so-called SOI structure. In Example 3, as FIGS. 9A and 9B show schematic partial cross-sectional views, the channel forming region 22, the source region 23, the drain region 24, the resistive element composed of an semiconductor region 31 provided in an extended region of the channel forming region 22, and the second conductive region 41 extending from the channel forming region 22 are formed inside a well structure provided in one surface of a semiconductor substrate. The insulated-gate field effect transistor in Example 3 can be the same as the transistor in Example 2 in the other points. FIG. 9A shows a schematic partial cross-sectional view similar to that taken along arrows A—A in FIG. 3A, and FIG. 9B shows a schematic partial cross-sectional view similar to that taken along arrows B—B in FIG. 3A.

EXAMPLE 4

Figure 10A:
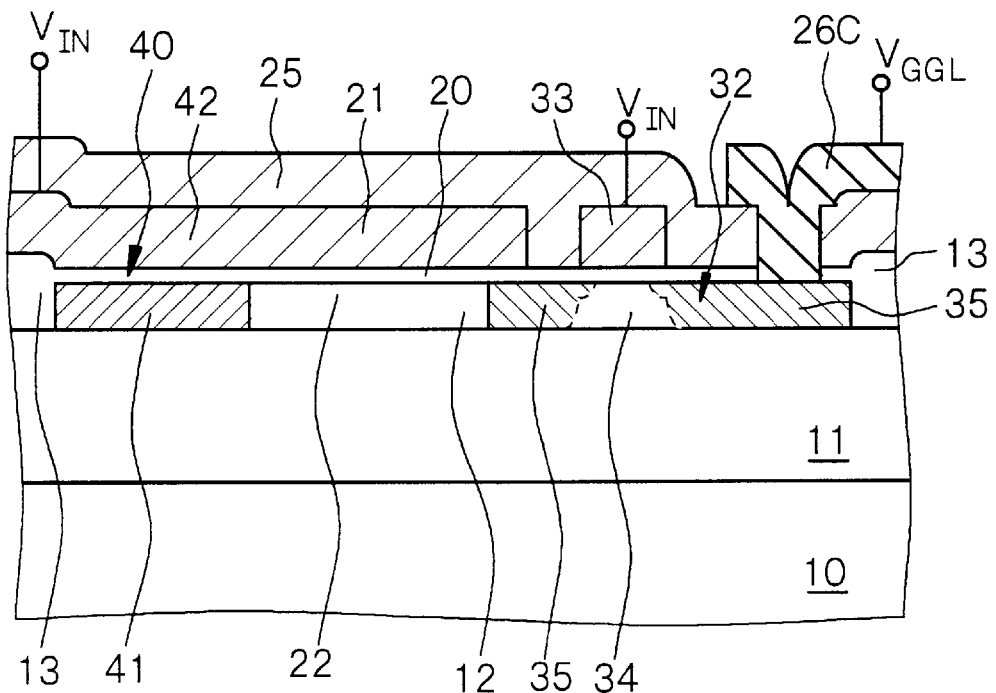
FIGS. 10A and 10B show schematic partial cross-sectional views of an insulated-gate field effect transistor in Example 4.

Example 4 is directed to a variant of the insulated-gate field effect transistor in Example 2 as well. In the insulated-gate field effect transistor in Example 2, the bias supplying means 30 is formed of a resistive element composed of the semiconductor region 31 provided in the extended region of the channel forming region 22. In Example 4, as FIG. 10A shows a schematic partial cross-sectional view, the bias supplying means 32 is formed of a transistor element formed in an extended region of the channel forming region 22. The transistor element constituting the bias supplying means 32 is composed of a gate portion 33, a channel forming portion 34 and source/drain portions 35. One of the source/drain portions 35 is extending from the channel forming region 22 of the insulated-gate field effect transistor, and the other of the source/drain portions 35 is connected to a prescribed potential $V_{GGL}$ through a wiring 26C. The conductivity type of a channel to be induced in the surface of the channel forming portion 34 of the transistor element forming the bias supplying means 32 is the same as, or opposite to, the conductivity type of a channel to be induced in the surface of the channel forming region 22 of the insulated-gate field effect transistor. The resistance value of the bias supplying means 32 can be controlled by selecting the conductivity type and controlling the impurity concentration of the channel forming portion 34 and be controlled by a bias applied to the gate portion 33. When the conductivity type of the channel of the transistor element is opposite to that of the channel of the insulated-gate field effect transistor, an input signal $V_{IN}$ is preferably supplied to the gate portion 33, as shown in 10A. On the other hand, when the conductivity type of the channel of the transistor element is the same as that of the channel of the insulated-gate field effect transistor, a signal having an approximately reverse phase to the phase of the input signal $V_{IN}$ is supplied to the gate portion 33, thereby obtaining an efficient operation of the insulated-gate field effect transistor. FIG. 10A shows a schematic partial cross-sectional view similar to that taken along arrows A—A in FIG. 3A. The cross-sectional structure of the insulated-gate field effect transistor in Example 4, similar to that taken along arrows B—B in FIG. 3, is the same as the cross-sectional structure shown in FIG. 4B.

When the conductivity type of the channel forming region 22 and the conductivity type of the source/drain portions 35 are the same, an extended region of the channel forming region 22 can be used as a substitute for one of the source/drain portions 35 by forming one of the source/drain portions 35 and the forming region 22 as a common region. As a result, the transistor element functions as the bias supplying means 32 without providing one of the source/drain portions 35.

Figure 10B:
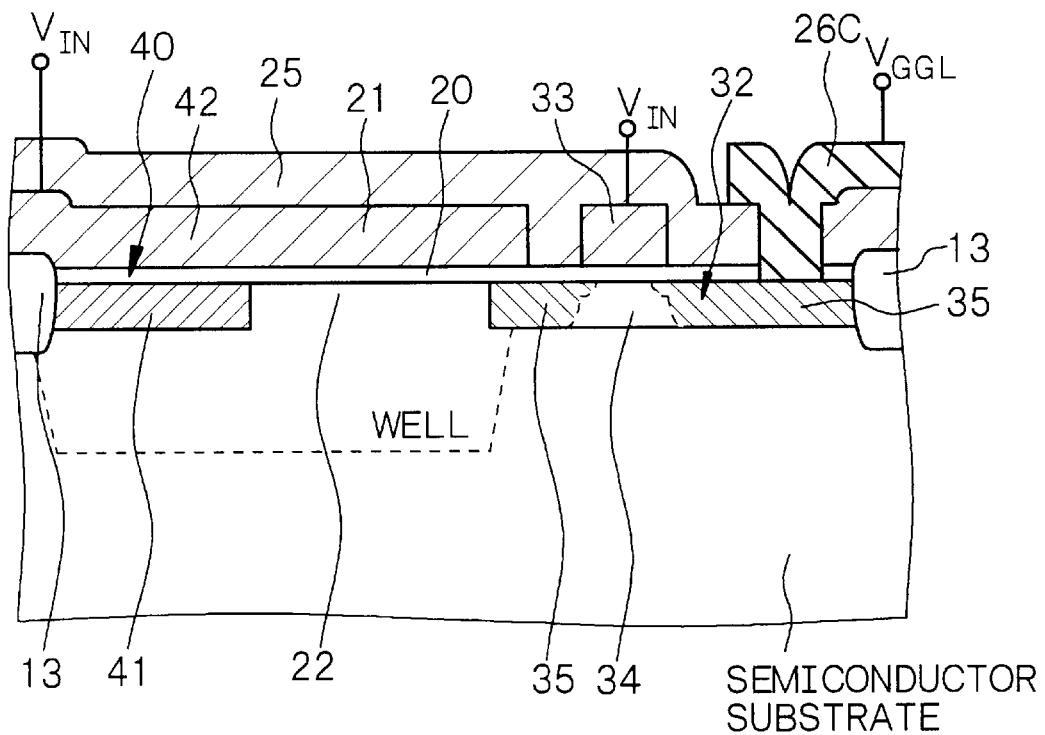

Alternatively, as FIG. 10B shows a schematic partial cross-sectional view, the insulated-gate field effect transistor in Example 4 can be a variant of the insulated-gate field effect transistor in Example 3. FIG. 10B shows a schematic partial cross-sectional view similar to that taken along arrows A—A in FIG. 3A. The cross-sectional structure of the insulated-gate field effect transistor in Example 4, similar to that taken along arrows B—B in FIG. 3, is the same as the cross-sectional structure shown in FIG. 9B.

Concerning the insulated-gate field effect transistor in Example 4, the gate oxide film of the transistor element forming the bias supplying means 32 can be formed of the gate insulation film 20 in Step-210 in Example 2, the gate portion 33 can be formed in Step 230, and the source/drain portions 35 can be formed in Step 240. Further, a wiring to the gate portion 33 can be formed in Step-250.

EXAMPLE 5

Figure 11:
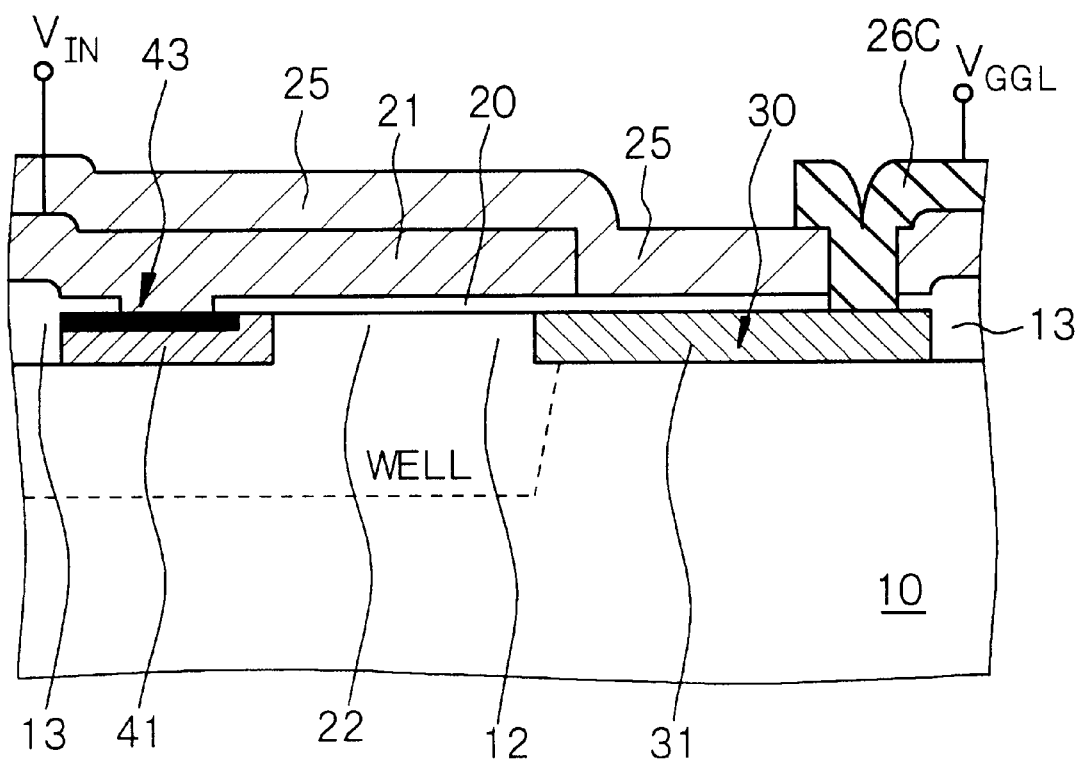
FIG. 11 shows a schematic partial cross-sectional view of an insulated-gate field effect transistor in Example 5.

Example 5 is directed to a variant of the insulated-gate field effect transistor in Example 5. In the insulated-gate field effect transistor in Example 2, the capacitive element 40 is composed of the first conductive region 42 extending from the gate region 21, the second conductive region 41 extending from the channel forming region 22 and the gate insulation film 20. In Example 5, as shown in FIG. 11, a capacitive element 43 is composed of a junction capacitor formed of a pn junction which is not deeply forward-biased. The above capacitive element 43 can be formed as follows. In Step-220 in Example 2, the silicon layer 12 is ion-implanted with a high concentration of an impurity for forming the second conductive region 41 to compose the capacitive element 40, and then the surface of the conductive region 41 is ion-implanted with an impurity having a conductivity type opposite to the conductivity type of the second conductive region 41. Alternatively, the capacitive element 43 explained in Example 5 can be applied to the insulated-gate field effect transistor explained in Example 3 or 4. FIG. 11 shows a schematic partial cross-sectional view similar to that taken along arrows A—A in FIG. 3A. The cross-sectional structure of the insulated-gate field effect transistor in Example 5, similar to that taken along arrows B—B in FIG. 3, is the same as the cross-sectional structure shown in FIG. 9B.

EXAMPLE 6

Figure 12A:
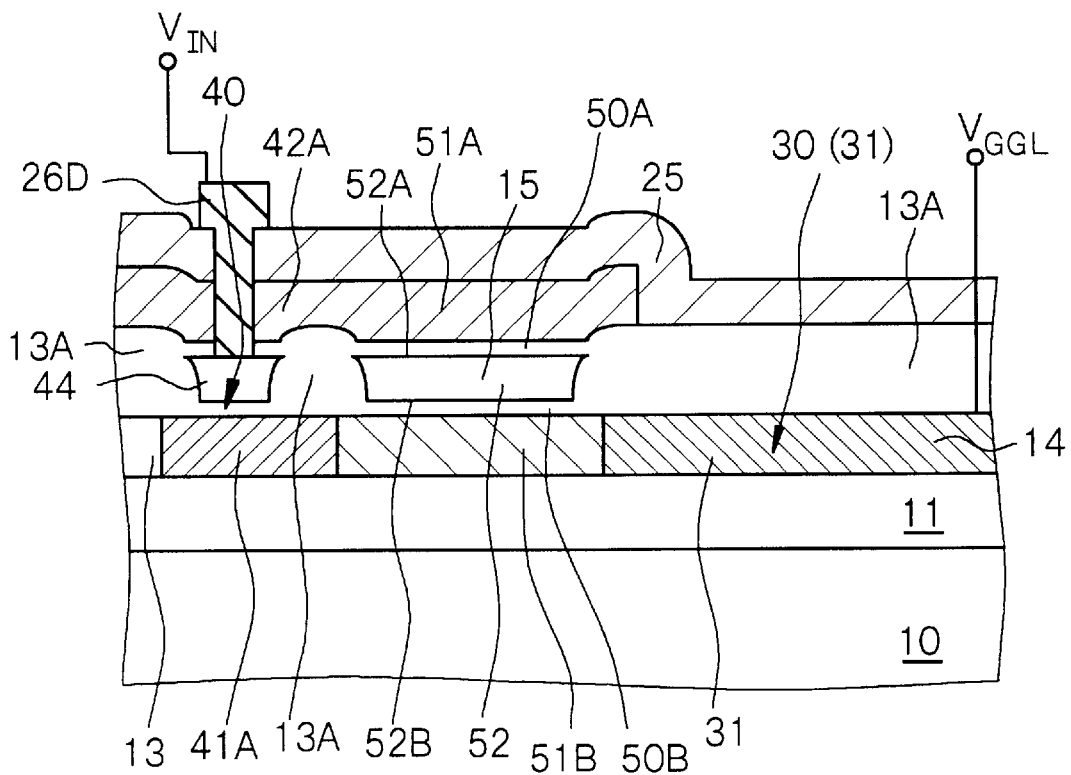
FIGS. 12A and 12B show schematic partial cross-sectional views of an insulated-gate field effect transistor in Example 6.
Figure 12B:
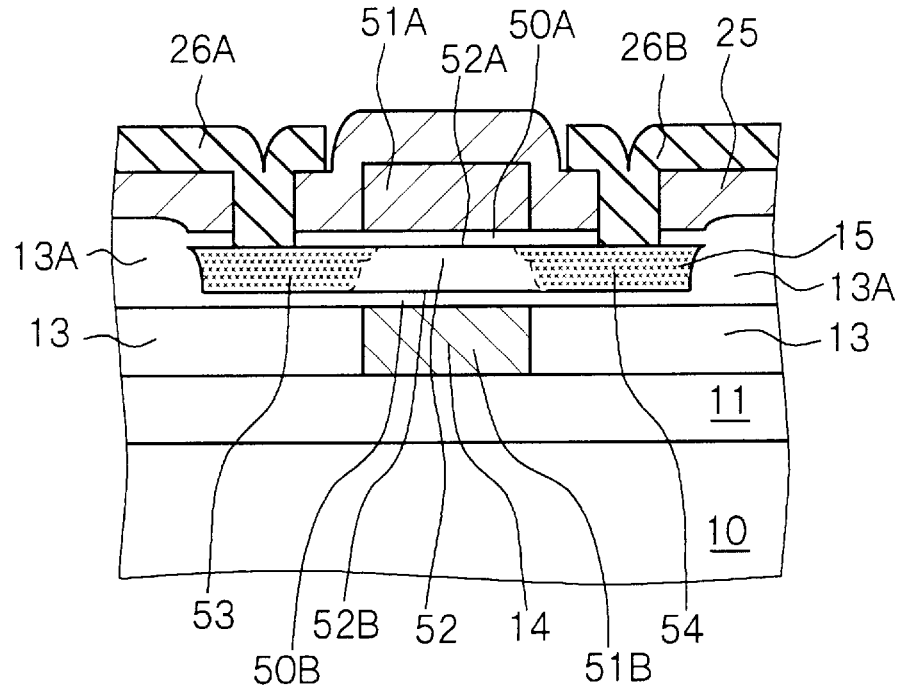
Figure 13A:
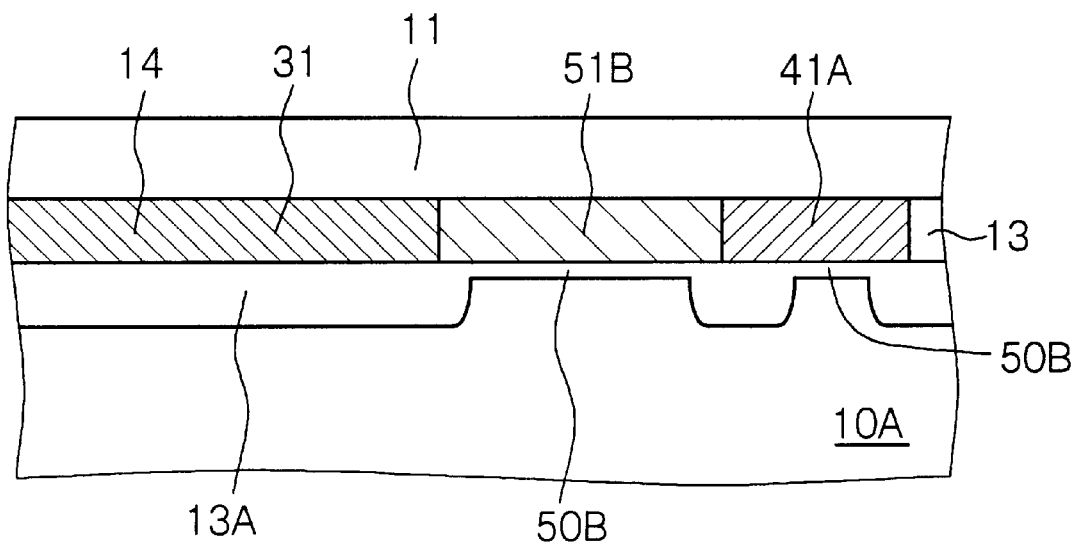
FIGS. 13A and 13B show schematic partial cross-sectional views of a support substrate, etc., for explaining the process for manufacturing the insulated-gate field effect transistor in Example 6.
Figure 13B:
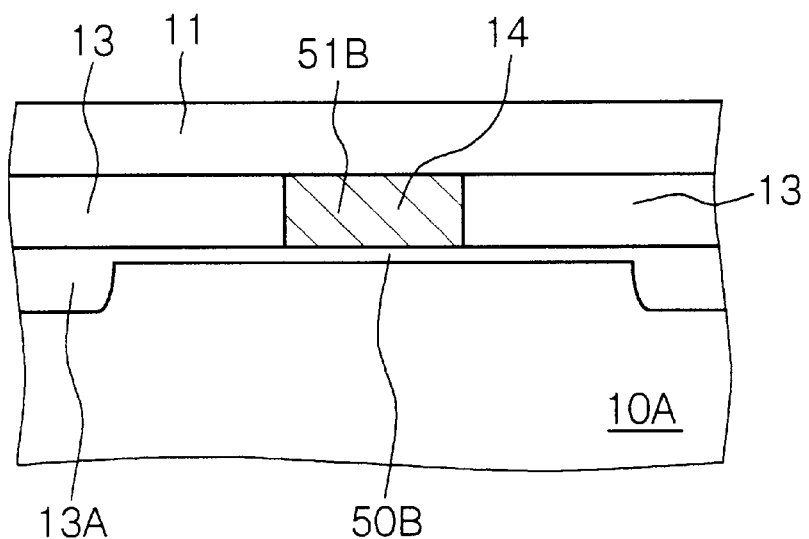
Figure 14A:
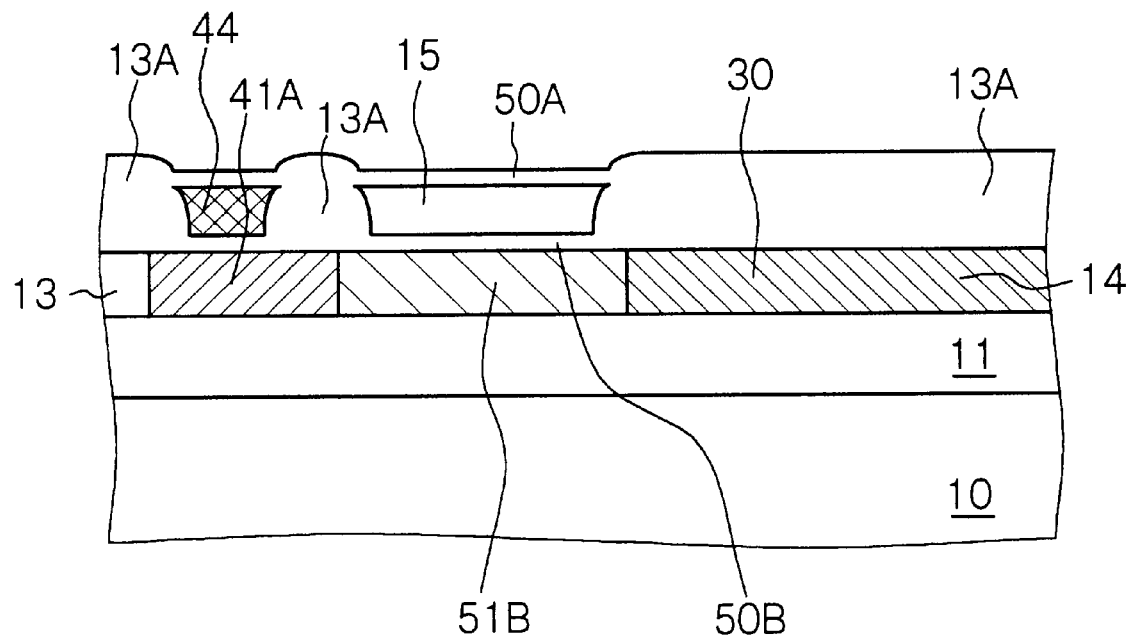
FIGS. 14A and 14B, subsequent to FIGS. 13A and 13B, show schematic partial cross-sectional views of a support substrate, etc., for explaining the process for manufacturing the insulated-gate field effect transistor in Example 6.
Figure 14B:
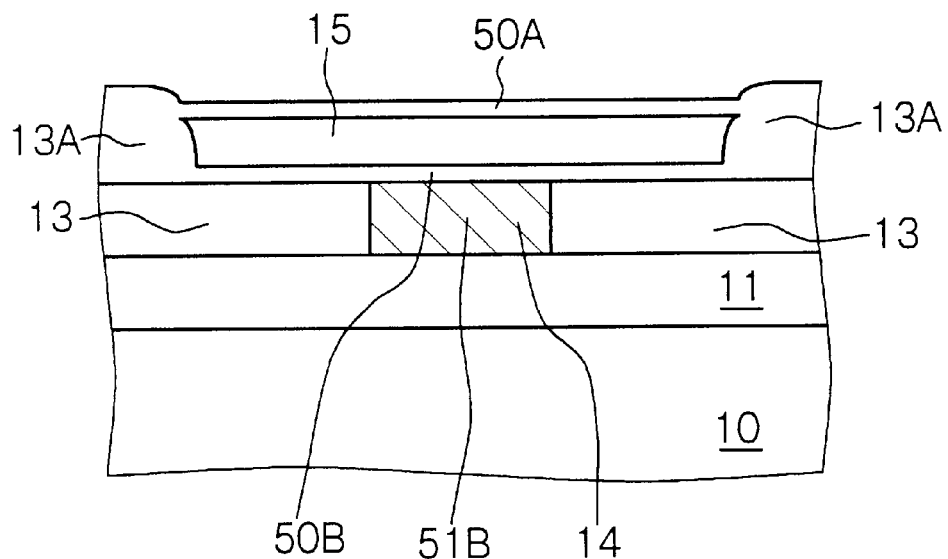
Figure 15A:
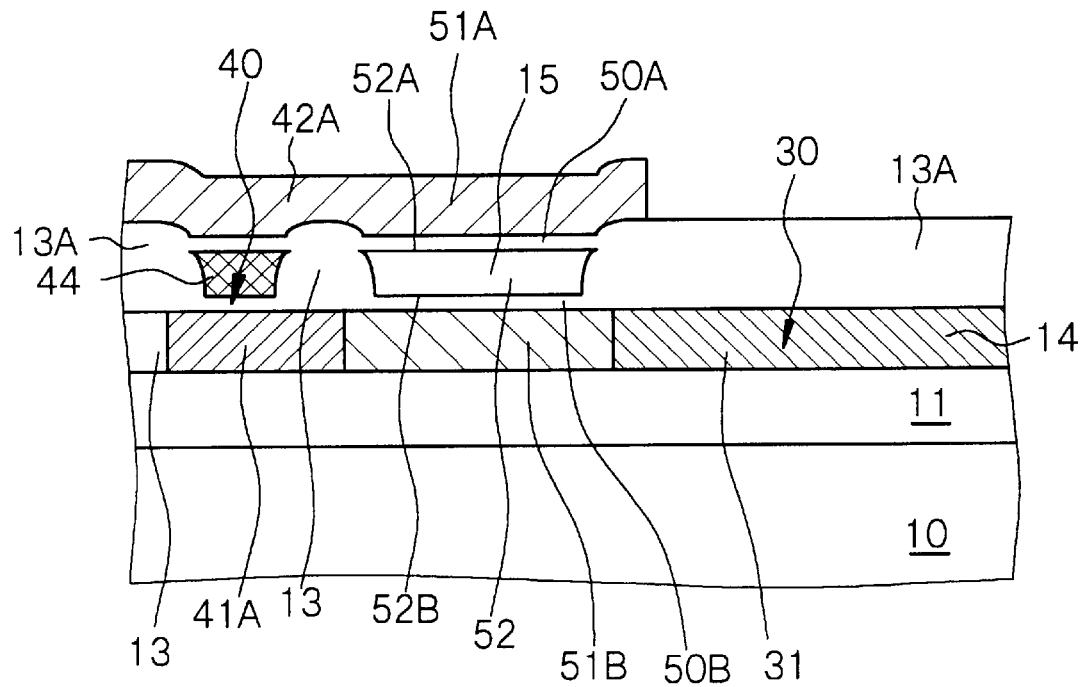
FIGS. 15A and 15B, subsequent to FIGS. 14A and 14B, show schematic partial cross-sectional views of a support substrate, etc., for explaining the process for manufacturing the insulated-gate field effect transistor in Example 6.
Figure 15B:
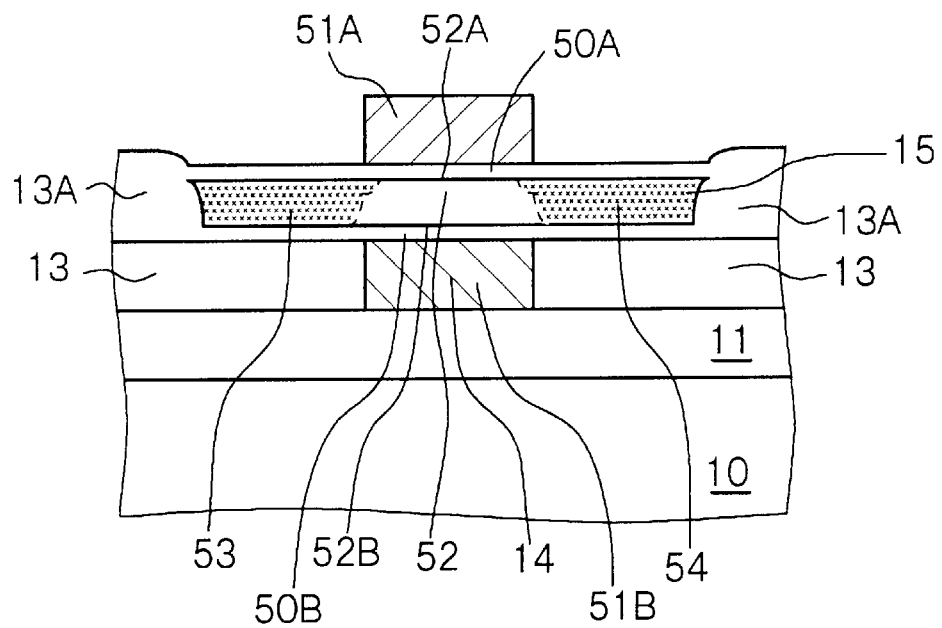

Example 6 is directed to the insulated-gate field effect transistor and the method of driving the same according to the second aspect of the present invention. FIGS. 12A and 12B show schematic partial cross-sectional views of the insulated-gate field effect transistor in Example 6. The insulated-gate field effect transistor in Example 6 is composed of a channel forming region 52 having a first main surface 52A and a second main surface 52B which face each other, a source region 53, a drain region 54, a first gate region 51A, a second gate region 51B, a bias supplying means 30 and a capacitive element 40. The first gate region 51A faces the first main surface 52A of the channel forming region 52 formed between the source region 53 and the drain region 54 and is formed on a first gate insulation film 50A. On the other hand, the second gate region 51B faces the second main surface 52B of the channel forming region 52 formed between the source region 53 and the drain region 54 and is formed on a second gate insulation film 50B.

A predetermined potential is applied to the second gate region 51B through the bias supplying means 30, and a signal having approximately the same phase as that of a signal supplied to the first gate region 51A is also supplied to the second gate region 51B through the capacitive element 40. More specifically, the predetermined potential supplied to the second gate region 51B is a potential (off-state potential $V_{OFF}$) for controlling the gate threshold voltage $V_{th\text{-}OFF}$ of the first gate region 51A of the insulated-gate field effect transistor in an off-state. The second gate region 51B is connected to a prescribed potential $V_{GGL}$ through the bias supplying means 30. The second gate region 51B is connected to a second conductive region 41A which is one end of the capacitive element 40. On the other hand, a conductive region 44 which is the other end of the capacitive element 40 is connected to the first gate region 51A. That is, the second gate region 51B is coupled with the first gate region 51A through the capacitive element 40.

In Example 6, the bias supplying means 30 is composed of a resistive element formed in an extended region of the second gate region 51B. The resistive element is composed of a semiconductor region 31 doped with an impurity. The concentration of the impurity in the semiconductor region 31 is lower than that of the source/drain regions 53 and 54. The capacitive element 40 is composed of a first conductive region 42 composed of an extended region of the first gate region 51A, a conductive region 44, a second conductive region 41A composed of an extended region of the second gate region 51B and the second gate insulation film 50B. The second conductive region 41A and the conductive region 44 correspond to electrodes of a capacitor, and the second gate insulation film 50B corresponds to a dielectric film of the capacitor. The conductive region 44 is formed on the second gate insulation film 50B, and the conductive region 44 is connected to the first conductive region 42A composed of the extended region of the first gate region 51A through a contact plug, and further is connected to a wiring 26D formed on the insulating interlayer 25. The channel forming region 52, the source region 53 and the drain region 54 are formed on an insulation layer 11. The insulation layer 11 is formed on a support substrate 10.

In the insulated-gate field effect transistor and the method of driving the same in Example 6, the gate threshold voltage $V_{th\text{-}OFF}$ seen from the first gate region 51A in an off-state of the insulated-gate field effect transistor is determined by the prescribed potential $V_{GGL}$. That is, since the second gate region 51B is connected to the prescribed potential $V_{GGL}$ through the bias supplying means 30, the second gate region 51B has an off-state potential $V_{OFF}$. By properly determining the off-state potential $V_{OFF}$, in other words, by properly selecting the above prescribed potential $V_{GGL}$, the leakage current in the off-state of the insulated-gate field effect transistor can be controlled so as to be equal to, or lower than, a desirable value. Further, since the prescribed potential $V_{GGL}$ can be properly selected, there can be reliably avoided the problem that some insulated-gate field effect transistors do not operate due to temperature dependence on the gate threshold voltage $V_{th\text{-}OFF}$ of the first gate region 51A, a variation among production lots or an in-plane variation on a wafer. Furthermore, the variation in the gate threshold voltage of the first gate region 51A, caused by the fluctuation in the impurity concentration of the channel forming region, can be minimized.

The second gate region 51B is coupled with the first gate region 51A through the capacitive element 40, and when the insulated-gate field effect transistor is driven into an on-state, a signal having approximately the same phase as that of an input signal $V_{IN}$ supplied to the first gate region 51A is supplied to the second gate region 51B through the capacitive element 40. The second gate region 51B therefore has an on-state potential $V_{ON}$ ($V_{ON}>V_{OFF}$ in n channel type and $V_{ON}<V_{OFF}$ in p channel type). As a result, the gate threshold voltage $V_{th\text{-}ON}$ of the first gate region 51A decreases and the insulated-gate field effect transistor can be operated at a low power supply voltage with a high speed.

The method of manufacturing the insulated-gate field effect transistor in Example 6 will be explained with reference to FIGS. 13A, 13B, 14A, 14B, 15A and 15B hereinafter. The insulated-gate field effect transistor in Example 6 is manufactured according to a so-called bonding SOI technique in which a semiconductor substrate and a support substrate are bonded to each other.

Step-600

First, an oxidation or etching mask composed of a silicon nitride film or silicon oxide film is formed on a surface portion of a starting substrate 10A composed, e.g., of a silicon semiconductor substrate where the source region 53, the drain region 54 and the channel forming region 52 of the insulated-gate field effect transistor and the conductive region 44 of the capacitive element are to be formed. Then, a selective oxidizing technique or a trench etching/refilling technique is applied to that portion of the starting substrate 10A which is not covered with the oxidation or etching mask, to form a field oxide film 13A. A portion in the vicinity of the surface of that portion of the starting substrate 10A which is not covered with the formed field oxide film 13A corresponds to a second silicon layer.

Step-610

Then, for forming a good-quality insulation film, the oxidation or etching mask is removed, and again, the second gate insulation film 50B is formed on that surface of the starting substrate 10A which is not covered with the formed field oxide film 13A, by a thermal oxidation method or a method of carrying out thermal oxidation and then thermal nitriding. Thereafter, a first silicon layer 14 is deposited on an entire surface by a CVD method, and a known selective oxidation is applied to a portion other than a portion of the first silicon layer 14 where the bias supplying means 30, the second gate region 51B of the insulated-gate field effect transistor and the first conductive region 41A of the capacitive element are to be formed, to form the field oxide film 13. The second gate insulation film 50B works as a gate oxide film, and at the same time, it works as a dielectric film of the capacitive element 40 as well.

Step-620

Then, the first silicon layer 14 is selectively ion-implanted with an impurity for forming the semiconductor region 31 which constitutes a resistive element as the bias supplying means 30. The dose of the above ion implantation can be set such that the resistance value of the bias supplying means 30 is brought into a desired value. On the other hand, the first silicon layer 14 is selectively ion-implanted with a high concentration of an impurity for forming the second conductive region 41A which constitutes the capacitive element 40. At the same time, the first silicon layer 14 is selectively ion-implanted with a high concentration of an impurity for forming the second gate region 51B, whereby a structure shown in FIGS. 13A and 13B can be obtained. The order of ion implantation procedures for the above regions is essentially arbitrary. Then, the insulation layer 11 is formed on an entire surface, and as required, a polysilicon layer is further deposited on the insulation layer 11. Then, the surface of the insulation layer 11 (or the polysilicon layer) is mirror-polished.

Then, a mirror-polished support substrate 10 formed, e.g., of a silicon semiconductor substrate and the mirror-polished surface of the starting substrate 10A are joined to each other, and the resultant set is heat-treated around 900° C., whereby a state of bonding at a molecular level or atomic level can be obtained. Then, the starting substrate 10A is polished from its back surface up to a predetermined thickness, and further, the starting substrate 10A is polished with the field oxide film 13A as a stopper, whereby a second silicon layer 15 can be obtained. Then, a defect on the surface of the second silicon layer 15 is removed by sacrifice oxidation and oxide film etching, and then the first gate insulation layer 50A is formed on the surface of the second silicon layer 15 which is a portion of the starting substrate 10A where the field oxide film 13A is not formed, by a thermal oxidation method or a method of carrying out thermal oxidation and then thermal nitriding, whereby a structure shown in 14A and 14B can be obtained.

It is not necessarily required to ion-implant the region of the above second silicon layer 15 where the channel forming region is to be formed, for controlling the gate threshold voltage of the first gate region 51A. The occurrence of a punchthrough can be prevented by decreasing the thickness of the second silicon layer 15 without introducing an impurity. The gate threshold voltage of the first gate region 51A cannot be controlled as it is. However, since the insulated-gate field effect transistor in Example 6 has the second gate region 51B, the gate threshold voltage of the first gate region 51A can be controlled by the electric potential of the second gate region 51B. Therefore, the occurrence of fluctuation in the gate threshold voltage of the first gate region 51A, caused by the ion implantation for forming the channel forming region, can be essentially avoided, because no need of impurity in the channel forming region.

Step-640

Then, a polysilicon layer doped with an impurity is deposited on an entire surface by a CVD method, and the polysilicon layer is patterned, to form the first gate region 51A and the first conductive region 42A composed of the extended region of the first gate region 51A. The first gate region 51A and the first conductive region 42A may be composed of a polycide layer formed of a polysilicon layer and a silicide layer such as $TiSi_2$, WSi, $CoSi_2$ or a bi-layered structure of a polysilicon layer and a tungsten layer, in place of the polysilicon layer.

Step-650

Then, the second silicon layer 15 is ion-implanted with an impurity, for forming an LDD structure, and then an $SiO_2$ layer is deposited on an entire surface by a CVD method. The so-formed $SiO_2$ layer is etched back to form side walls (not shown) on the side surfaces of the first gate region 51A and the first conductive region 42A. Then, the second silicon layer 15 is ion-implanted with an impurity and annealed for activation, and the channel forming region 52, the source region 53 and the drain region 54 are formed in the second silicon layer 15 (see FIGS. 15A and 15B).

Step-660

Then, the insulating interlayer 25 composed, e.g., of $SiO_2$ is deposited on an entire surface by a CVD method, and contact openings are formed in the insulating interlayer 25 on the source region 53 and the drain region 54 by an RIE method. Further, a contact opening is also formed in the first gate insulation film 50A, the first conductive region 42A and the insulating interlayer 25 on the conduction region 44A by an RIE method. Then, an aluminum alloy layer is deposited on an entire surface including inner surfaces of the contact openings, e.g., by a sputtering method, and the aluminum alloy layer is patterned to form wirings 26A, 26B and 26D. In the above manner, an insulated-gate field effect transistor having the structure shown in FIGS. 12A and 12B can be produced. Alternatively, the contact openings may be filled with tungsten, e.g., by a blanket tungsten method to form contact plugs composed of tungsten inside the contact openings, and then an aluminum alloy layer may be deposited on the insulating interlayer 25, e.g., by a sputtering method. The semiconductor region 31 constituting the resistive element which is the bias supplying means 30 can be properly connected to a prescribed potential $V_{GGL}$ with a wiring (not shown).

EXAMPLE 7

Figure 16:
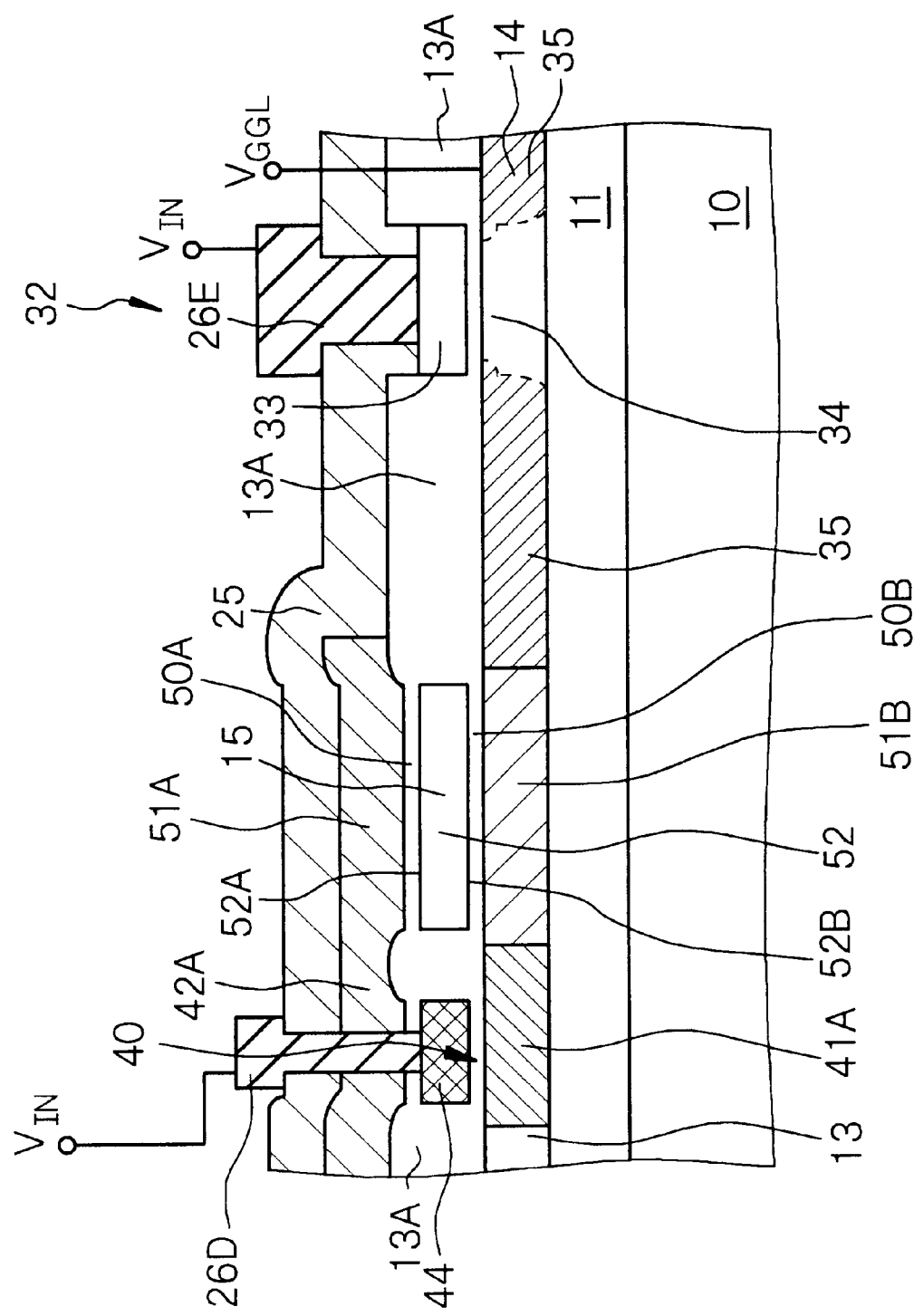
FIG. 16 shows a schematic partial cross-sectional view of an insulated-gate field effect transistor in Example 7.
Figure 17:
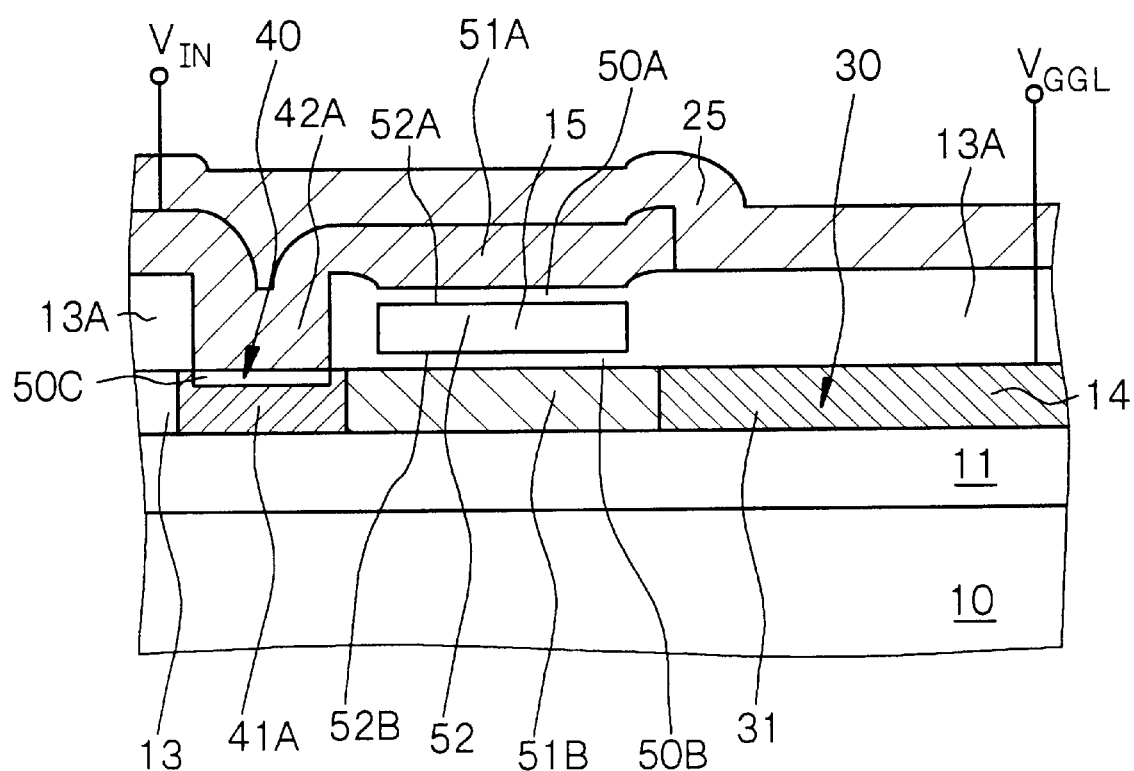
FIG. 17 shows a schematic partial cross-sectional view of an insulated-gate field effect transistor in Example 8.
Figure 18:
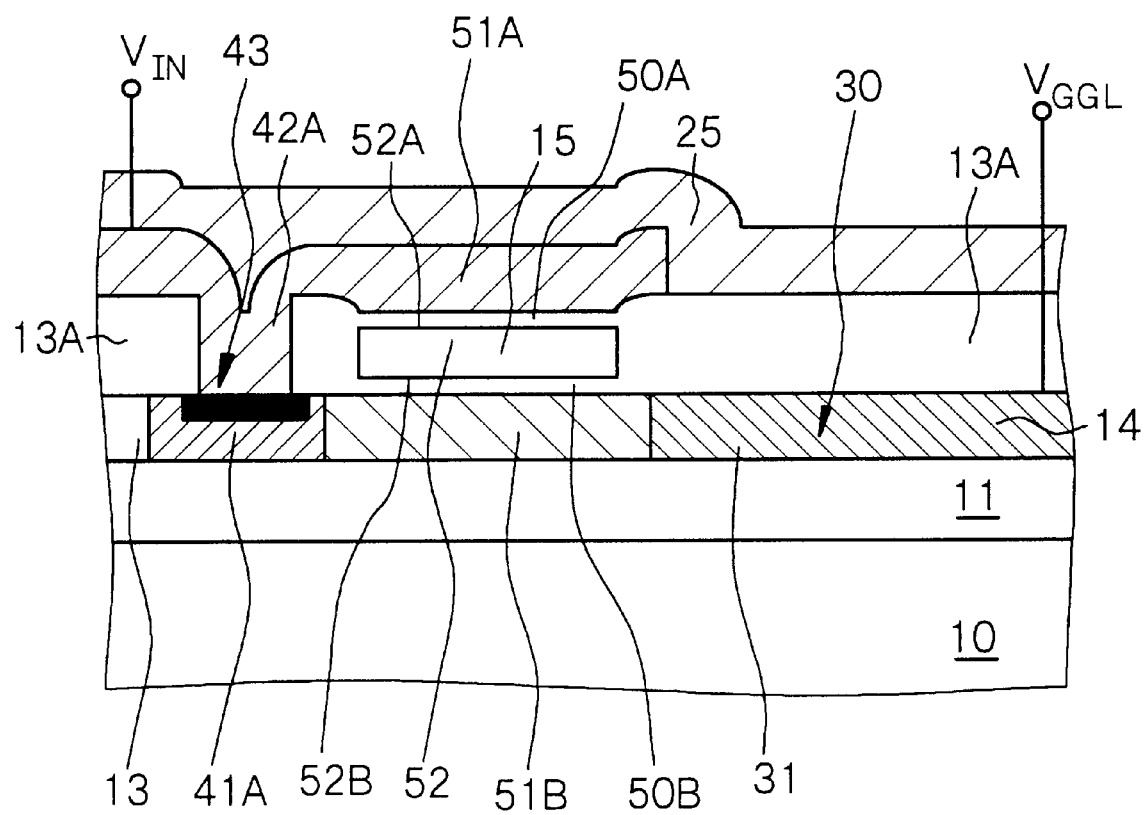
FIG. 18 shows a schematic partial cross-sectional view of an insulated-gate field effect transistor in Example 9.

Example 7 is directed to a variant of the insulated-gate field effect transistor in Example 6. In the insulated-gate field effect transistor in Example 6, as FIGS. 12A and 12B show schematic partial cross-sectional views, the bias supplying means 30 is embodied as a resistive element composed of a semiconductor region 31 formed in the extended portion of the second gate region 51B. In Example 7, as FIG. 16 shows a schematic partial cross-sectional view, the bias supplying means 32 is composed of a transistor element formed in the extended region of the second gate region 51B. The transistor element constituting the bias supplying means 32 is composed of a gate portion 33, a channel forming portion 34 and source/drain portions 35. One of the source/drain portions 35 is extending from he second gate region 51B of the insulated-gate field effect transistor. The other of the source/drain portions 35 is connected to a prescribed potential $V_{GGL}$. The conductivity type of a channel to be induced in the surface of the channel forming portion 34 of the transistor element is the same as, or opposite to, the conductivity type of a channel to be induced in the channel forming region 52. Further, when the conductivity type of the channel of the transistor element is opposite to the conductivity type of the channel of the insulated-gate field effect transistor, a signal having approximately the same phase as the phase of a signal applied to the first gate region 51A of the insulated-gate field effect transistor is applied to the gate portion 33 of the transistor element constituting the bias supplying means 32. The resistance value of the above bias supplying means 32 can be controlled by selecting the conductivity type and controlling the impurity concentration of the channel forming portion 34 and be controlled by a bias applied to the gate portion 33. FIGS. 16, 17 and 18 show schematic partial cross-sectional views similar to that taken along arrows A—A in FIG. 3A. The cross-sectional structures of the insulated-gate field effect transistors in Examples 7 to 9, similar to that taken along arrows B—B in FIG. 3A, are the same as the cross-sectional structure shown in FIG. 12B.

For manufacturing the insulated-gate field effect transistor in Example 7, in a step similar to Step-600 in Example 6, an oxidation or etching mask is also formed on a portion of the starting substrate 10A where the gate portion of the transistor element constituting the bias supplying means 32 is to be formed, and in a step similar to Step-610, an gate oxide film is also formed on the surface of a portion of the starting substrate 10A where the gate portion of the transistor element constituting the bias supplying means 32 is to be formed. Further, a step similar to Step-630 in Example 6 is carried out to form the gate portion 33 from the second silicon layer 15. Prior to the above procedure, the source/drain portions 35 of the transistor element constituting the bias supplying means 32 can be formed, together with the formation of the second conductive region 41A constituting the capacitive element 40 and the formation of the second gate region 51B, by carrying out a step similar to Step-620 in Example 6. Further, a wiring 26E to the gate portion 33 can be provided in a step similar to Step-660.

EXAMPLE 8

Example 8 is also directed to a variant of the insulated-gate field effect transistor in Example 6. In Example 8, as FIG. 17 shows a schematic partial cross-sectional view, the bias supplying means 30 is a resistive element formed in an extended portion of the second gate region 51B. The resistive element is composed of a semiconductor region 31 doped with an impurity. The capacitive element 40 is composed of a first conductive region 42A composed of an extended region of a first gate region 51A, a second conductive region 41A composed of an extended region of a second gate region 51B and a dielectric film 50C. The first conductive region 42A and the second conductive region 41A correspond to electrodes of a capacitor, and the dielectric film 50C corresponds to a dielectric film of a capacitor.

The dielectric film 50C and the second conductive region 41A in contact therewith can be formed by the following method. That is, in a step similar to Step-600 in Example 6, a field oxide film 13A is formed on the surface of a portion of a starting substrate 10A where the capacitive element 40 is to be formed, without forming an oxidation or etching mask thereon. In a step similar to Step-630 in Example 6, an opening portion is formed in the field oxide film 13A before the sacrifice oxidation. In a step similar to Step-630 in Example 6, the first gate insulation film 50A is formed, and at the same time, the dielectric film 50C of the same material with the gate insulation film 50A is formed on the surface of the second conductive region 41A exposed in a bottom of the opening portion formed in the field oxide film 13A. The first gate insulation film 50A may be formed in one step, and the dielectric film 50C may be formed in another step. Then, a polysilicon layer doped with an impurity is deposited on an entire surface by a CVD method, and the polysilicon layer is patterned to form the first gate region 51A and the first conductive region 42A composed of the extended region of the first gate region 51A. The capacitive element 40 explained in Example 8 may be applied to the insulated-gate field effect transistor explained in Example 7.

EXAMPLE 9

Example 9 is directed to a variant of the insulated-gate field effect transistor in Example 8. In the insulated-gate field effect transistor in Example 8, the capacitive element 40 is composed of the first conductive region 42A composed of the extended region of the first gate region 51A, the second conductive region 41A composed of the extended region of the second gate region 51B and the second gate insulation film 50B. In Example 9, as shown in FIG. 18, a capacitive element 43 is composed of a junction capacitor formed of a pn junction which is not deeply forward-biased. The above capacitive element 43 can be formed as follows. In a step in Example 8, after an opening portion is formed in the field oxide film 13A, the surface of the second conductive region 41A is ion-implanted with an impurity having a conductivity type opposite to the conductivity type of the second conductive region 41A. The capacitive element 43 explained in Example 9 can be applied to the insulated-gate field effect transistor explained in Example 7.

Figure 1B:
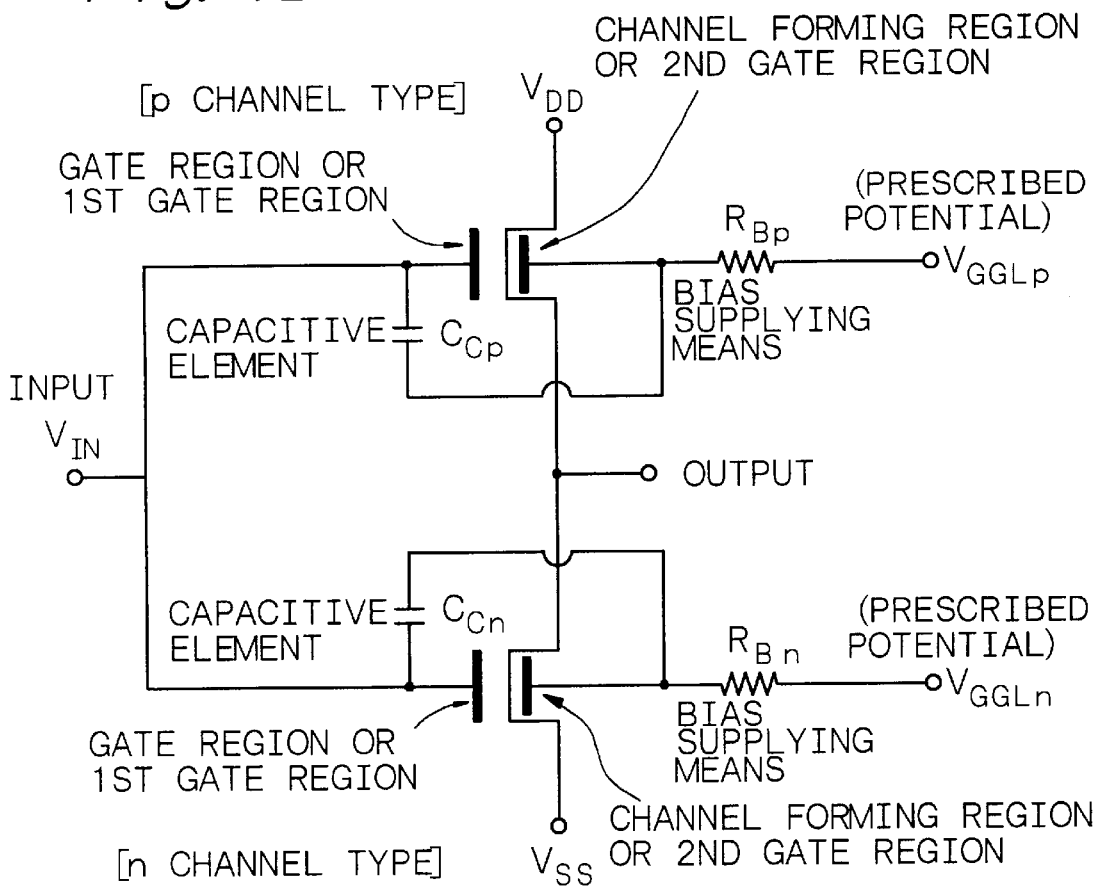
Figure 2B:
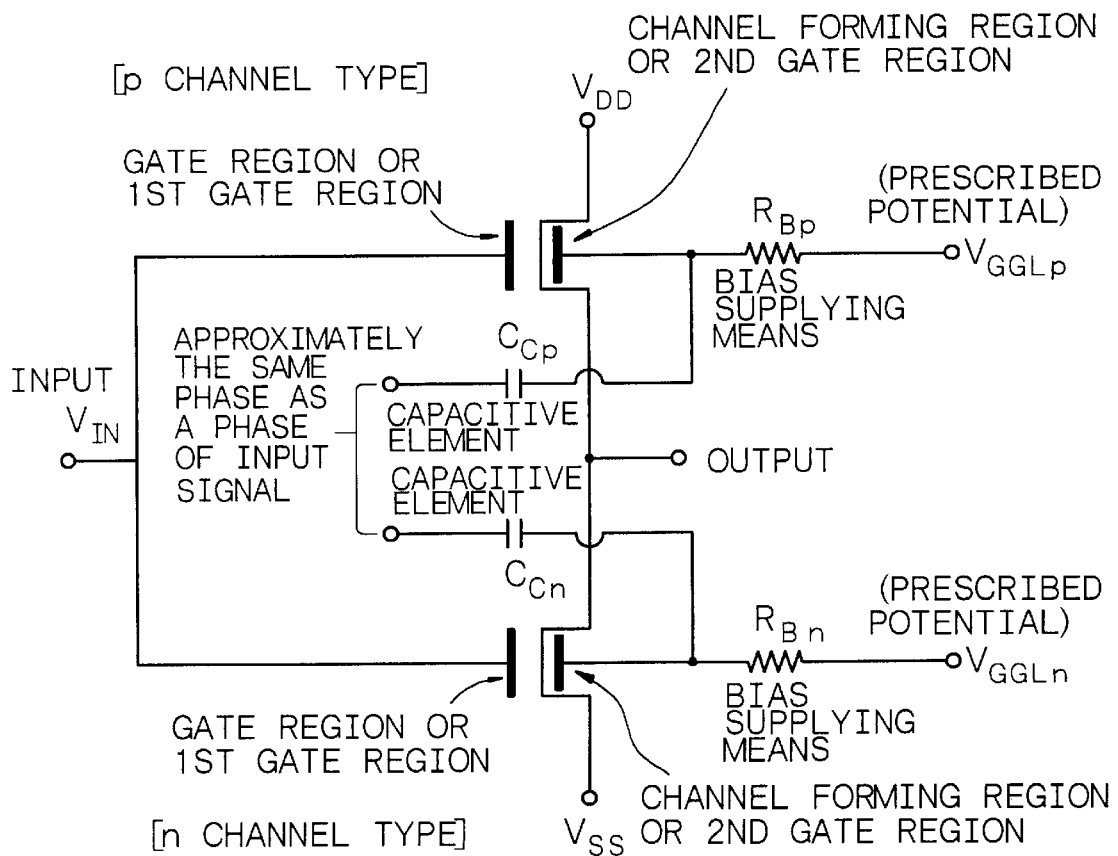

The present invention is explained on the basis of Examples hereinabove, while the present invention shall not be limited to thereto. The structures of the insulated-gate field effect transistors explained in Examples are shown as examples, and may be modified as required. For example, the insulated-gate field effect transistor explained in any one of Examples 2 to 9 can be applied to a CMOS insulated-gate field effect transistor of which the equivalent circuit is shown in FIGS. 1B or FIG. 2B. Those various materials described as materials for the insulated-gate field effect transistor are examples, and may be changed as required. In the insulated-gate field effect transistor and the method of driving the same according to the second aspect of the present invention, the insulated-gate field effect transistor may have a configuration in which a first gate region is formed on an insulation layer, a channel forming region is formed on the first gate region and a second gate region is formed on the channel forming region.

Figure 19:
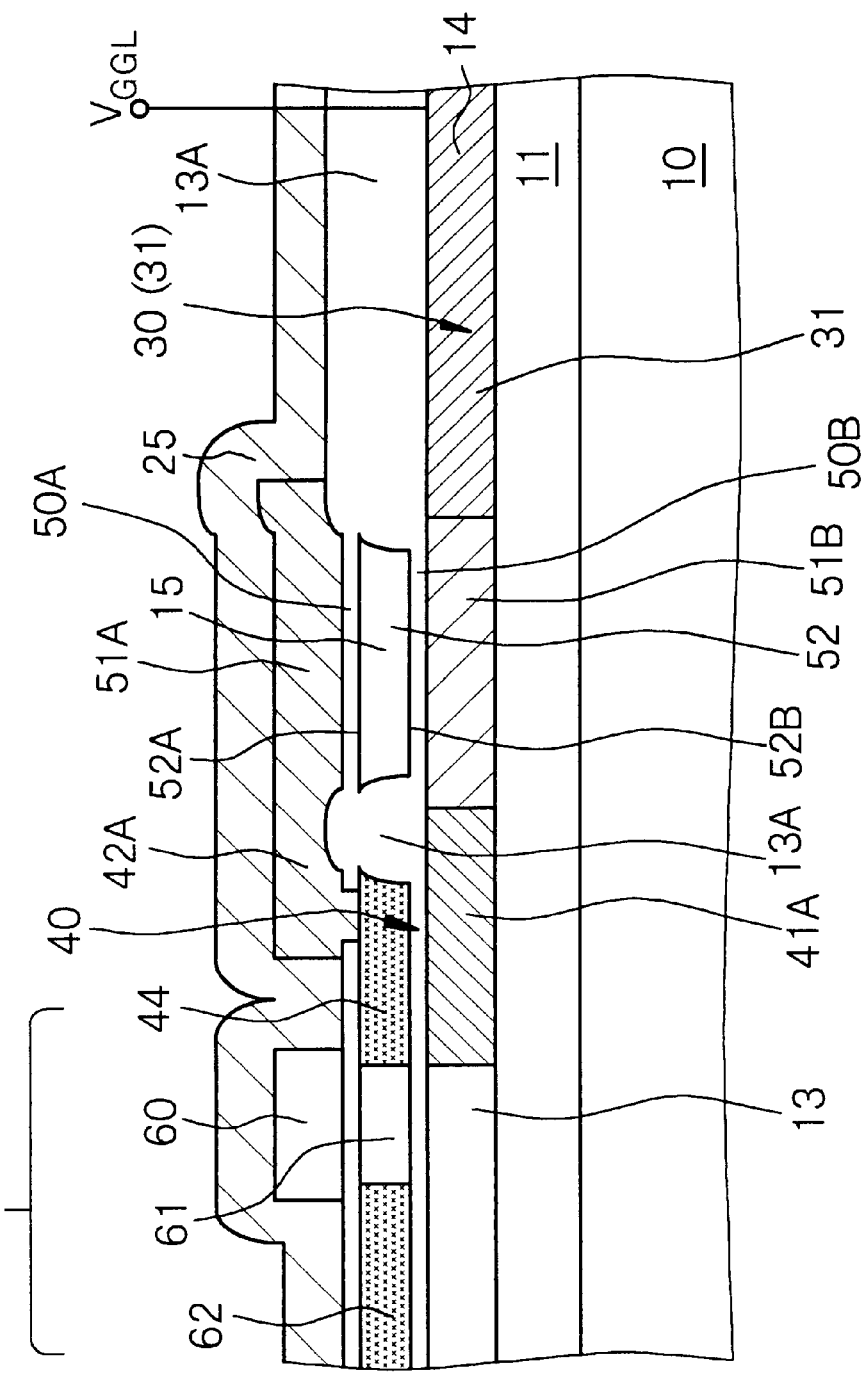
FIG. 19 shows a schematic partial cross-sectional view of a variant of the insulated-gate field effect transistor in Example 6, shown in FIGS. 12A and 12B.
Figure 20:
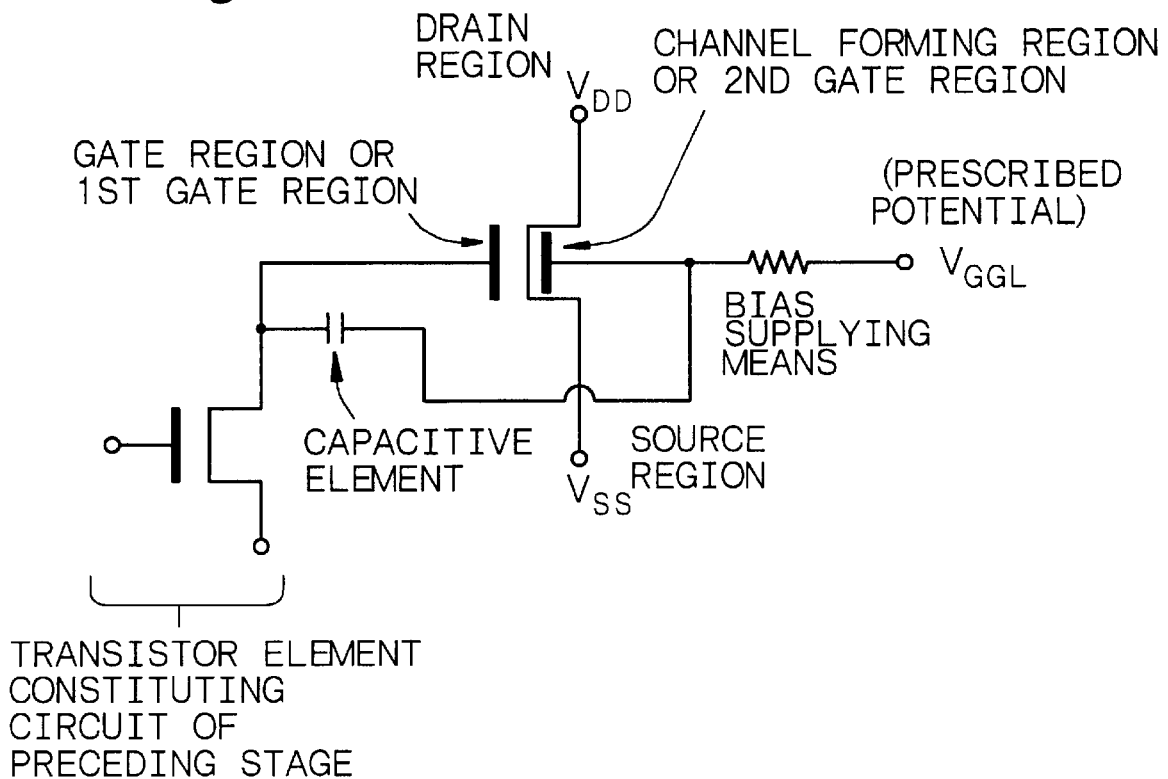
FIG. 20 shows an equivalent circuit prepared by more embodying the equivalent circuit of the insulated-gate field effect transistor shown in FIG. 2A.
Figure 21:
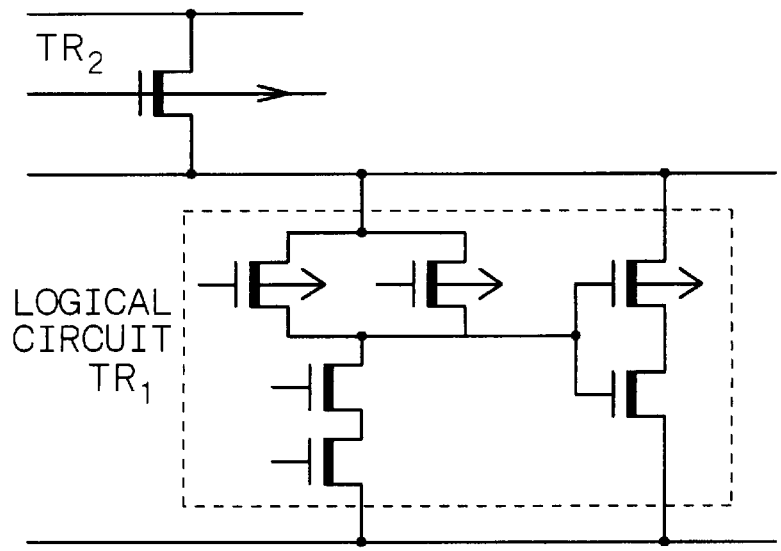
FIG. 21 shows an equivalent circuit for explaining the constitution of the first prior art.
Figure 22:
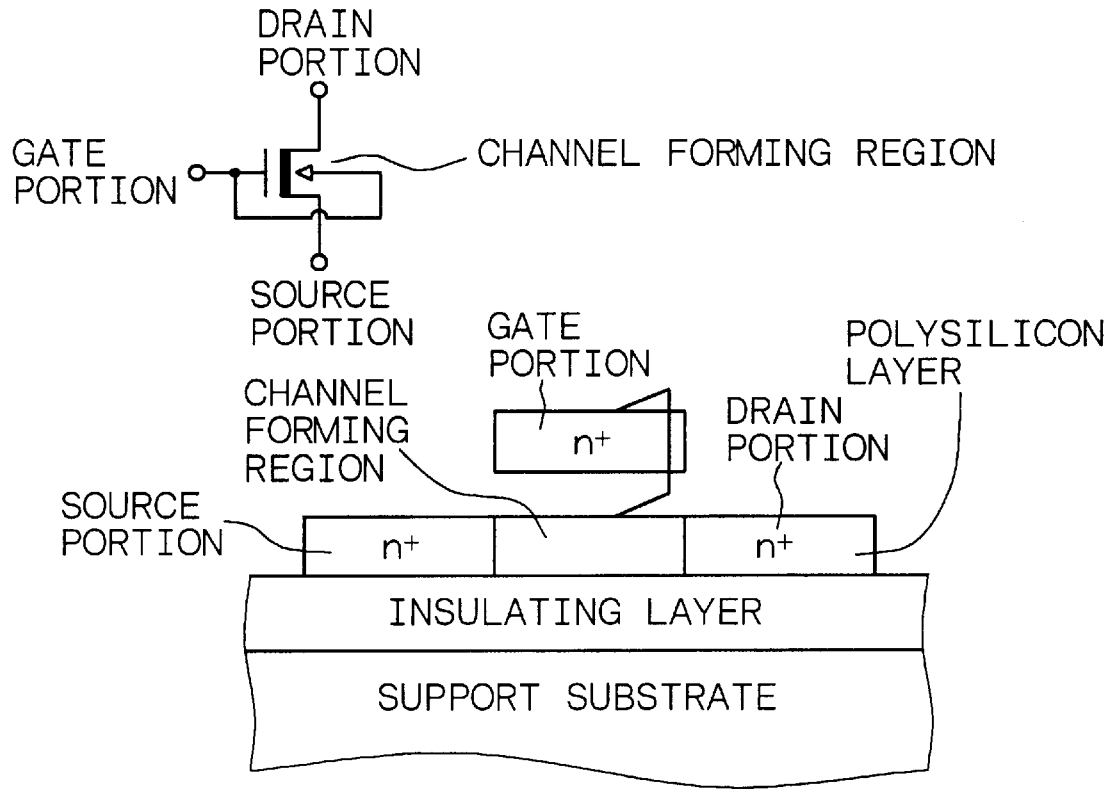
FIG. 22 shows an equivalent circuit and a schematic partial cross-sectional view of a semiconductor device for explaining the constitution of the second prior art.
Figure 23:
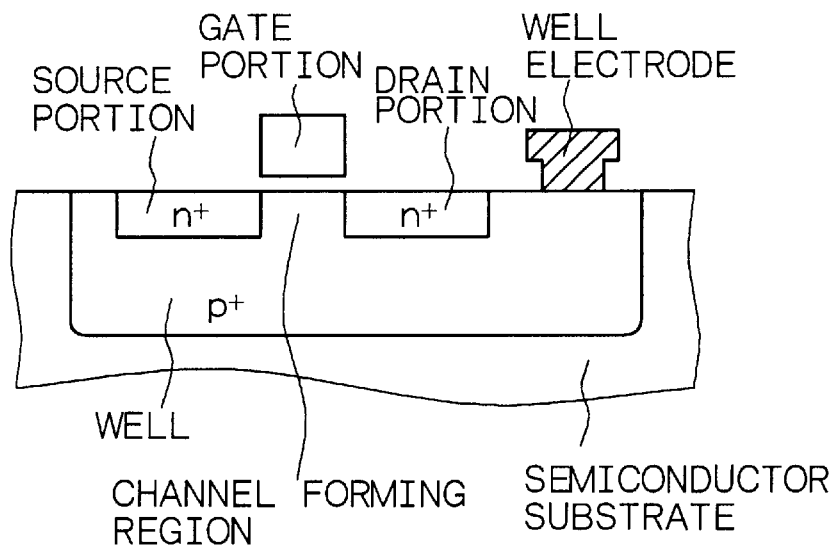
FIG. 23 shows a schematic partial cross-sectional view of a semiconductor device for explaining the constitution of the third prior art.

Examples mainly show constitutions in which one end of the capacitive element is connected to the channel forming region or the second gate region and the other end is connected to the gate region or the first gate region, while the insulated-gate field effect transistor and the method of driving the same, provided by the present invention, shall not be limited to the above constitutions. The insulated-gate field effect transistor can be structurally simplified and the number of steps of its manufacturing can be decreased when the method of driving the insulated-gate field effect transistor in which the capacitive element is not directly connected to the gate region is adopted as shown in FIG. 2A. For achieving the above method, an output portion of a circuit (e.g., a drain region of the transistor) at a stage immediately before the insulated-gate field effect transistor and the second gate region, or an output portion of a circuit at a stage with an odd number before the insulated-gate field effect transistor and the second gate region 51B may be connected to each other through the capacitive element 40. FIG. 20 shows an equivalent circuit of an insulated-gate field effect transistor having the above constitution, and FIG. 19 shows its schematic partial cross-sectional view. In FIG. 19, reference numerals 60, 61 and 62 indicate a gate region, a channel forming region and a source region of a transistor element constituting a circuit at a stage immediately before the insulated-gate field effect transistor. Further, the drain region of the transistor element constituting a circuit at a stage immediately before the insulated-gate field effect transistor and the conductive region 44 are formed as a common region. The insulated-gate field effect transistor shown in FIG. 19 is variant of the insulated-gate field effect transistor in Example 6 shown in FIGS. 12A and 12B. However, the constitution of the insulated-gate field effect transistor of which the equivalent circuit is shown in FIG. 20 shall not be limited to the constitution shown in FIG. 19.

In the present invention, a potential for controlling the gate threshold voltage of the insulated-gate field effect transistor in an off-state is applied to the channel forming region through the bias supplying means, or a predetermined potential is applied to the second gate region through the bias supplying means. Therefore, not only the leakage current of the insulated-gate field effect transistor in an off-state can be controlled to be equal to, or smaller than, a desirable value, but also there can be reliably overcome the problem that some insulated-gate field effect transistors do not operate due to temperature dependence on the gate threshold voltage, a variation among production lots or an in-plane variation on a wafer. Further, the insulated-gate field effect transistor can be operated at a low power supply voltage with a high speed. Furthermore, there can be prevented the occurrence of fluctuation in the gate threshold voltage caused by the fluctuation in the impurity concentration of the channel forming region.

What is claimed is:

1. An insulated-gate field effect transistor comprising;
    (A) a channel forming region,
    (B) source/drain regions formed in contact with the channel forming region, the source/drain regions being spaced from each other,
    (C) a gate region formed on a gate insulation film formed on the surface of the channel forming region, the gate region and the channel forming region facing each other through the gate insulation film,
    (D) a bias supplying means, and
    (E) a capacitive element,
        wherein a potential for controlling a gate threshold voltage of the insulated-gate field effect transistor in an off-state thereof is applied to the channel forming region through the bias supplying means, and
        a signal having approximately the same phase as a phase of a signal supplied to the gate region is supplied to the channel forming region through the capacitive element.

2. The insulated-gate field effect transistor according to claim 1, wherein the potential applied to the channel forming region is different from a potential applied to one source/drain region and is different from a potential applied to the other source/drain region.

3. The insulated-gate field effect transistor according to claim 1, wherein the bias supplying means is a resistive element formed in an extended region of the channel forming region.

4. The insulated-gate field effect transistor according to claim 1, wherein the bias supplying means is a transistor element having a gate portion, a channel forming portion and source/drain portions, and
    a potential to generate, at one source/drain portion, the potential for controlling the gate threshold voltage of the insulated-gate field effect transistor in an off-state thereof is applied to the other source/drain portion.

5. The insulated-gate field effect transistor according to claim 4, wherein the transistor element is formed in an extended region of the channel forming region.

6. The insulated-gate field effect transistor according to claim 4, wherein a channel to be induced in the surface of the channel forming portion of the transistor element has an opposite conductivity type to the conductivity type of a channel to be induced in the surface of the channel forming region of the insulated-gate field effect transistor, and
    a signal having approximately the same phase as a phase of the signal supplied to the gate region of the insulated-gate field effect transistor is supplied to the gate portion of the transistor element.

7. The insulated-gate field effect transistor according to claim 1, wherein the capacitive element has a first conductive region formed of an extended region of the gate region, a second conductive region formed of an extended region of the channel forming region, and a dielectric film sandwiched between the first conductive region and the second conductive region.

8. The insulated-gate field effect transistor according to claim 7, wherein the dielectric film is formed of an extended region of the gate insulation film.

9. The insulated-gate field effect transistor according to claim 1, wherein the capacitive element is formed of a junction capacitor.

10. The insulated-gate field effect transistor according to claim 1, wherein the channel forming region and the source/drain regions are formed on an insulation layer.

11. An insulated-gate field effect transistor comprising;
    (A) a channel forming region having a first main surface and a second main surface, the first and second main surfaces facing each other,
    (B) source/drain regions formed in contact with the channel forming region, the source/drain regions being spaced from each other,
    (C) a first gate region formed on a first gate insulation film formed on the first main surface of the channel forming region, the first gate region and the channel forming region facing each other through the first gate insulation film,
    (D) a second gate region formed on a second gate insulation film formed on the second main surface of the channel forming region, the second gate region and the channel forming region facing each other through the second gate insulation film,
    (E) a bias supplying means, and
    (F) a capacitive element,
        wherein a predetermined potential is applied to the second gate region through the bias supplying means, and
        a signal having approximately the same phase as a phase of a signal supplied to the first gate region is supplied to the second gate region through the capacitive element.

12. The insulated-gate field effect transistor according to claim 11, wherein the predetermined potential applied to the second gate region is a potential for controlling a gate threshold voltage of the first gate region of the insulated-gate field effect transistor in an off-state thereof.

13. The insulated-gate field effect transistor according to claim 11, wherein the bias supplying means is a resistive element formed in an extended region of the second gate region.

14. The insulated-gate field effect transistor according to claim 11, wherein the bias supplying means is a transistor element having a gate portion, a channel forming portion and source/drain portions, and
    a potential to generate, at one source/drain portion, the potential for controlling the gate threshold voltage of the first gate region of the insulated-gate field effect transistor in an off-state thereof is applied to the other source/drain portion.

15. The insulated-gate field effect transistor according to claim 14, wherein the transistor element is formed in an extended region of the second gate region.

16. The insulated-gate field effect transistor according to claim 14, wherein a channel to be induced in the surface of the channel forming portion of the transistor element has an opposite conductivity type to the conductivity type of a channel to be induced in the surface of the channel forming region of the insulated-gate field effect transistor, and a signal having approximately the same phase as a phase of the signal supplied to the first gate region of the insulated-gate field effect transistor is supplied to the gate portion of the transistor element.

17. The insulated-gate field effect transistor according to claim 11, wherein the capacitive element has a first conductive region, a second conductive region, and a dielectric film sandwiched between the first conductive region and the second conductive region, the first conductive region is formed of an extended region of the first gate region, and the second conductive region is formed of an extended region of the second gate region.

18. The insulated-gate field effect transistor according to claim 17, wherein the dielectric film is formed of an extended region of the second gate insulation film.

19. The insulated-gate field effect transistor according to claim 17, wherein the dielectric film is simultaneously formed when the first gate insulation film is formed.

20. The insulated-gate field effect transistor according to claim 17, wherein a conductive region as an electrode of the capacitive element is formed between the first conductive region and the dielectric film, and the conductive region is connected with the first conductive region through a contact plug.

21. The insulated-gate field effect transistor according to claim 11, wherein the capacitive element is formed of a junction capacitor.

22. The insulated-gate field effect transistor according to claim 11, wherein the channel forming region and the source/drain regions are formed on an insulation layer.

23. A method for driving an insulated-gate field effect transistor having;

(A) a channel forming region, (B) source/drain regions formed in contact with the channel forming region, the source/drain regions being spaced from each other, (C) a gate region formed on a gate insulation film formed on the surface of the channel forming region, the gate region and the channel forming region facing each other through the gate insulation film, (D) a bias supplying means, and (E) a capacitive element, the method comprising;

applying to the channel forming region through the bias supplying means a potential for controlling a gate threshold voltage of the insulated-gate field effect transistor in an off-state thereof, and supplying to the channel forming region through the capacitive element a signal having approximately the same phase as a phase of a signal supplied to the gate region.

24. The method according to claim 23, wherein the potential applied to the channel forming region is different from a potential applied to one source/drain region and is different from a potential applied to the other source/drain region.

25. The method according to claim 23, wherein the bias supplying means is a resistive element formed in an extended region of the channel forming region.

26. The method according to claim 23, wherein the bias supplying means is a transistor element having a gate portion, a channel forming portion and source/drain portions, and a potential to generate, at one source/drain portion, the potential for controlling the gate threshold voltage of the insulated-gate field effect transistor in an off-state thereof is applied to the other source/drain portion.

27. The method according to claim 26, wherein the transistor element is formed in an extended region of the channel forming region.

28. The method according to claim 26, wherein a channel to be induced in the surface of the channel forming portion of the transistor element has an opposite conductivity type to the conductivity type of a channel to be induced in the surface of the channel forming region of the insulated-gate field effect transistor, and a signal having approximately the same phase as a phase of the signal supplied to the gate region of the insulated-gate field effect transistor is supplied to the gate portion of the transistor element.

29. The method according to claim 23, wherein the capacitive element has a first conductive region formed of an extended region of the gate region, a second conductive region formed of an extended region of the channel forming region, and a dielectric film sandwiched between the first conductive region and the second conductive region.

30. The method according to claim 29, wherein the dielectric film is formed of an extended region of the gate insulation film.

31. The method according to claim 23, wherein the capacitive element is formed of a junction capacitor.

32. The method according to claim 23, wherein the channel forming region and the source/drain regions are formed on an insulation layer.

33. A method for driving an insulated-gate field effect transistor having;

(A) a channel forming region having a first main surface and a second main surface, the first and second main surfaces facing each other, (B) source/drain regions formed in contact with the channel forming region, the source/drain regions being spaced from each other, (C) a first gate region formed on a first gate insulation film formed on the first main surface of the channel forming region, the first gate region and the channel forming region facing each other through the first gate insulation film, (D) a second gate region formed on a second gate insulation film formed on the second main surface of the channel forming region, the second gate region and the channel forming region facing each other through the second gate insulation film, (E) a bias supplying means, and (F) a capacitive element, the method comprising;

applying a predetermined potential to the second gate region through the bias supplying means, and supplying to the second gate region through the capacitive element a signal having approximately the same phase as a phase of a signal supplied to the first gate region.

34. The method according to claim 33, wherein the predetermined potential applied to the second gate region is a potential for controlling a gate threshold voltage of the first gate region of the insulated-gate field effect transistor in an off-state thereof.

35. The method according to claim 33, wherein the bias supplying means is a resistive element formed in an extended region of the second gate region.

36. The method according to claim 33, wherein the bias supplying means is a transistor element having a gate portion, a channel forming portion and source/drain portions, and a potential to generate, at one source/drain portion, the potential for controlling the gate threshold voltage of the first gate region of the insulated-gate field effect transistor in an off-state thereof is applied to the other source/drain portion.

37. The method according to claim 36, wherein the transistor element is formed in an extended region of the second gate region.

38. The method according to claim 36, wherein a channel to be induced in the surface of the channel forming portion of the transistor element has an opposite conductivity type to the conductivity type of a channel to be induced in the surface of the channel forming region of the insulated-gate field effect transistor, and a signal having approximately the same phase as a phase of the signal supplied to the first gate region of the insulated-gate field effect transistor is supplied to the gate portion of the transistor element.

39. The method according to claim 33, wherein the capacitive element has a first conductive region, a second conductive region and a dielectric film sandwiched between the first conductive region and the second conductive region, the first conductive region is formed of an extended region of the first gate region, and the second conductive region is formed of an extended region of the second gate region.

40. The method according to claim 39, wherein the dielectric film is formed of an extended region of the second gate insulation film.

41. The method according to claim 39, wherein the dielectric film is simultaneously formed when the first gate insulation film is formed.

42. The method according to claim 39, wherein a conductive region as an electrode of the capacitive element is formed between the first conductive region and the dielectric film, and the conductive region is connected with the first conductive region through a contact plug.

43. The method according to claim 33, wherein the capacitive element is formed of a junction capacitor.

44. The method according to claim 33, wherein the channel forming region and the source/drain regions are formed on an insulation layer.

* * * * *